United States Patent
Grossmann et al.

(10) Patent No.: US 10,771,722 B2
(45) Date of Patent: Sep. 8, 2020

(54) METHODS FOR ENABLING IN-FIELD SELECTION OF NEAR-SENSOR DIGITAL IMAGING FUNCTIONS

(71) Applicants: Peter J. Grossmann, Somerville, MA (US); Matthew Stamplis, Boston, MA (US); Kate Thurmer, Somerville, MA (US); Brian Tyrrell, Brookline, NH (US); Jonathan Frechette, Marlborough, MA (US)

(72) Inventors: Peter J. Grossmann, Somerville, MA (US); Matthew Stamplis, Boston, MA (US); Kate Thurmer, Somerville, MA (US); Brian Tyrrell, Brookline, NH (US); Jonathan Frechette, Marlborough, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/145,272

(22) Filed: Sep. 28, 2018

(65) Prior Publication Data
US 2019/0104269 A1  Apr. 4, 2019

Related U.S. Application Data

(60) Provisional application No. 62/565,511, filed on Sep. 29, 2017.

(51) Int. Cl.
*H04N 5/378* (2011.01)
*H04N 5/369* (2011.01)
(Continued)

(52) U.S. Cl.
CPC ....... *H04N 5/378* (2013.01); *H01L 27/14634* (2013.01); *H01L 27/14649* (2013.01);
(Continued)

(58) Field of Classification Search
CPC ...... H04N 5/378; H04N 5/374; H04N 5/3765; H04N 5/379; H01L 27/14634; H01L 27/14649; H03M 9/00; H03K 19/17744
(Continued)

(56) References Cited

U.S. PATENT DOCUMENTS

| 8,179,296 B2 | 5/2012 | Kelly et al. |
| 8,605,853 B2 | 12/2013 | Schultz et al. |

(Continued)

OTHER PUBLICATIONS

Di Lorenzo et al., "PARISROC, a photomultiplier array integrated read out chip." 2009 IEEE Nuclear Science Symposium Conference Record (NSS/MIC). IEEE, 2009, 8 pages.
(Continued)

*Primary Examiner* — Lin Ye
*Assistant Examiner* — Chan T Nguyen
(74) *Attorney, Agent, or Firm* — Smith Baluch LLP

(57) ABSTRACT

An imaging device is often paired with a readout integrated circuit (ROIC), which provides processing and data transfer functionality. The circuitry of a ROIC is typically specialized to meet the requirements of an application, which limits the ROIC to a few modes of operation and restricts compatibility to only certain types of imaging devices and applications. Furthermore, the circuitry supporting the processing functionality is limited due to size constraints on the ROIC. These shortcomings can be overcome with a field programmable imaging array (FPIA), which can be implemented as an integrated circuit combining customized ROIC sensor interface circuitry with field programmable gate array (FPGA) circuitry to enable post-fabrication definition of ROIC operational modes. An FPIA chip may form part of a three-chip stack that also includes an analog sensor interface chip for analog-to-digital conversion and an imaging device.

21 Claims, 33 Drawing Sheets

(51) Int. Cl.
    *H01L 27/146* (2006.01)
    *H04N 5/376* (2011.01)
    *H04N 5/374* (2011.01)
    *H03K 19/17736* (2020.01)
    *H03M 9/00* (2006.01)

(52) U.S. Cl.
    CPC ............ *H04N 5/374* (2013.01); *H04N 5/379* (2018.08); *H04N 5/3765* (2013.01); *H03K 19/17744* (2013.01); *H03M 9/00* (2013.01)

(58) Field of Classification Search
    USPC .................................................. 348/294
    See application file for complete search history.

(56) References Cited

U.S. PATENT DOCUMENTS

| | | | |
|---|---|---|---|
| 8,692,176 | B2 | 4/2014 | Kelly et al. |
| 8,933,832 | B2 | 1/2015 | Kelly et al. |
| 9,159,446 | B2 | 10/2015 | Schultz et al. |
| 9,270,895 | B2 | 2/2016 | Kelly et al. |
| 9,385,738 | B2 | 7/2016 | Kelly et al. |
| 9,491,389 | B2 | 11/2016 | Kelly et al. |
| 9,615,038 | B2 | 4/2017 | Kelly et al. |
| 9,712,771 | B2 | 7/2017 | Kelly et al. |
| 9,743,024 | B2 | 8/2017 | Tyrrell et al. |
| 9,768,785 | B2 | 9/2017 | Schultz et al. |
| 9,866,770 | B2 | 1/2018 | Colonero et al. |
| 10,079,984 | B2 | 9/2018 | Kelly et al. |
| 10,142,567 | B2 | 11/2018 | Colonero et al. |
| 10,250,831 | B2 | 4/2019 | Tyrrell et al. |
| 10,348,993 | B2 | 7/2019 | Kelly et al. |
| 10,362,254 | B2 | 7/2019 | Kelly et al. |
| 10,425,598 | B2 | 9/2019 | Lin et al. |
| 10,491,839 | B2 | 11/2019 | Colonero et al. |
| 2010/0030509 | A1 | 2/2010 | Crain, II et al. |
| 2010/0127174 | A1 | 5/2010 | Tener et al. |
| 2013/0321639 | A1 | 12/2013 | Kuiken et al. |
| 2017/0023405 | A1 | 1/2017 | Fahim et al. |
| 2017/0026603 | A1 | 1/2017 | Kelly et al. |
| 2017/0208274 | A1 | 7/2017 | Kelly et al. |
| 2017/0230596 | A1* | 8/2017 | Colonero ............ H04N 5/3743 |
| 2017/0351634 | A1* | 12/2017 | Fustos ................ G06F 13/4221 |
| 2017/0366763 | A1 | 12/2017 | Lin et al. |
| 2018/0035067 | A1 | 2/2018 | Tyrrell et al. |
| 2018/0160068 | A1 | 6/2018 | Kelly et al. |
| 2019/0068279 | A1 | 2/2019 | Shaw et al. |
| 2019/0075264 | A1 | 3/2019 | Kelly et al. |
| 2019/0335129 | A1 | 10/2019 | Tyrrell et al. |

OTHER PUBLICATIONS

International Search Report and Written Opinion in International Patent Application No. PCT/US18/53380 dated Aug. 5, 2019, 13 pages.
Rufo et al., Real Time Coincidence Processing Algorithm for Geiger Mode LADAR using FPGAs. MIT Lincoln Laboratory Lexington United States, 2017, 13 pages.
Bekker et al., "An FPGA-based focal plane array interface for the panchromatic Fourier transform spectrometer." Aerospace Conference, 2011 IEEE. IEEE, 2011. 10 pages.
Casas et al., "Characterization of radiation effects in 65 nm digital circuits with the DRAD digital radiation test chip." Journal of Instrumentation 12.02 (2017): C02039. 11 pages.
Cho et al., "Development of the readout controller for KASINICS." Ground-based and Airborne Instrumentation for Astronomy. vol. 6269. International Society for Optics and Photonics, 2006. 9 pages.
Craig et al., "Processing 3D flash LADAR point-clouds in real-time for flight applications." Sensors and Systems for Space Applications. vol. 6555. International Society for Optics and Photonics, 2007. 10 pages.
Fiorante et al., "Spatio-temporal bias-tunable readout circuit for on-chip intelligent image processing." IEEE Transactions on Circuits and Systems I: Regular Papers 63.11 (2016): 1825-1832.
Fiorante et al., "Spatio-temporal tunable pixels for multi-spectral infrared imagers." Circuits and Systems (MWSCAS), 2013 IEEE 56th International Midwest Symposium on. IEEE, 2013. 4 pages.
Fiorante, Spatio-temporal circuits for imaging sensors. The University of New Mexico, 2013.138 pages.
Gehrer et al., "Area-efficient PUF-based key generation on system-on-chips with FPGAs." Journal of Circuits, Systems and Computers 25.01 (2016): 1640002. 20 pages.
Ghasemibenhangi, "Intelligent ROIC for Real-time In-pixel Image Processing." (2017). University of New Mexio. 150 pages.
Grant et al., "A new dual threshold time-over-threshold circuit for fast timing in PET." Physics in Medicine & Biology 59.13 (2014): 3421. 11 pages.
Guo, Study and design on the optimal filter of incremental σδ adc. Tsinghua University (People's Republic of China), 2011. Abstract Only. 1 page.
Heim, "YARR-A PCIe based Readout Concept for Current and Future ATLAS Pixel Modules." Journal of Physics: Conference Series. vol. 898. No. 3. IOP Publishing, 2017. 9 pages.
Hwang et al., "Pixelwise readout integrated circuits with pixel-level ADC for microbolometers." Infrared Technology and Applications XXXIII. vol. 6542. International Society for Optics and Photonics, 2007. 9 pages.
Jung et al., "An improved time over threshold method using bipolar signals." Physics in Medicine & Biology 63.13 (2018): 135002. 12 pages.
Kasinski et al., "Dual-stage, Time-over-Threshold based prototype readout ASIC for silicon microstrip sensors." Microelectronics Journal 46.12 (2015): 1248-1257.
Kizhner et al., "On Destiny instrument electrical and electronics subsystem framework." Adaptive Hardware and Systems (AHS), 2010 NASA/ESA Conference on. IEEE, 2010. 7 pages.
Kizhner et al., "On Destiny science instrument electrical and electronics subsystem framework." Aerospace Conference, 2010 IEEE. IEEE, 2010. 7 pages.
Ko et al., "Reliability of key technologies in 3D integration." Microelectronics Reliability 53.1 (2013): 7-16.
Koerner et al., "X-ray analog pixel array detector for single synchrotron bunch time-resolved imaging." Journal of synchrotron radiation 18.2 (2011): 157-164.
Lee et al., "Development of a DAQ system for a plasma display panel-based X-ray detector (PXD)." Nuclear Instruments and Methods in Physics Research Section A: Accelerators, Spectrometers, Detectors and Associated Equipment 784 (2015): 213-219.
Lewis, Jay, "Reconfigurable Imaging (ReImagine)," DARPA/MTO Proposer's Day, Sep. 30, 2016, 44 pp.
Liu et al., "Development of a modular test system for the silicon sensor R&D of the ATLAS Upgrade." Journal of Instrumentation 12.01 (2017): P01008. 11 pages.
Luo et al., Terahertz focal plane imaging array sensor based on AlGaN/GaN field effect transistors. Hongwai Yu Jiguang Gongcheng/Infrared and Laser Engineering 47.3 (Mar. 25, 2018). DOI: http://dx.doi.org/10.3788/IRLA201847.0320001. English Abstract only.
Seounghyun, Readout controller: development of the readout controller for infrared array. Publications of the Korean Astronomical Society 21.2 (2006): 67-74.
Stramaglia et al., Firmware development and testing of the ATLAS IBL Back of Crate card. Journal of Instrumentation 10.2 (Feb. 2015): C02035 (8). 9 pages.
Sun et al., "HgCdTe e-APD detector arrays with single photon sensitivity for space lidar applications." Advanced Photon Counting Techniques VIII. vol. 9114. International Society for Optics and Photonics, 2014. 11 pages.
Tian et al., "High energy X-ray photon counting imaging using linear accelerator and silicon strip detectors." Nuclear Instruments and Methods in Physics Research Section A: Accelerators, Spectrometers, Detectors and Associated Equipment 830 (2016): 251-255.

(56) References Cited

OTHER PUBLICATIONS

Vasile, "Low-cost LADAR imagers." Laser Radar Technology and Applications XIII. vol. 6950. International Society for Optics and Photonics, 2008. 7 pages.
Wensing, "Testing and firmware development for the ATLAS IBL BOC prototype." Journal of Instrumentation 7.12 (2012): C12027. 11 pages.
Zhang et al., "Infrared Biosensor Test System under Pulsed Bias Voltage." Applied Mechanics and Materials. vol. 411. Trans Tech Publications, 2013. 7 pages.
Zhang et al., Design of precision timing circuit for scannerless 3D laser imaging. Beijing Ligong Daxue Xuebao/Transaction of Beijing Institute of Technology 35.9 (Jan. 1, 2015): 936-940. English Abstract Only.

\* cited by examiner

FIG. 7A

|  |  |  |  |  |  |  |  |
|---|---|---|---|---|---|---|---|
| 56 | 48 | 40 | 32 | 24 | 16 | 8 | 0 |
| 57 | 49 | 41 | 33 | 25 | 17 | 9 | 1 |
| 58 | 50 | 42 | 34 | 26 | 18 | 10 | 2 |
| 59 | 51 | 43 | 35 | 27 | 19 | 11 | 3 |
| 60 | 52 | 44 | 36 | 28 | 20 | 12 | 4 |
| 61 | 53 | 45 | 37 | 29 | 21 | 13 | 5 |
| 62 | 54 | 46 | 38 | 30 | 22 | 14 | 6 |
| 63 | 55 | 47 | 39 | 31 | 23 | 15 | 7 |

Pair 1
Pair 2
Pair 3
Pair 4

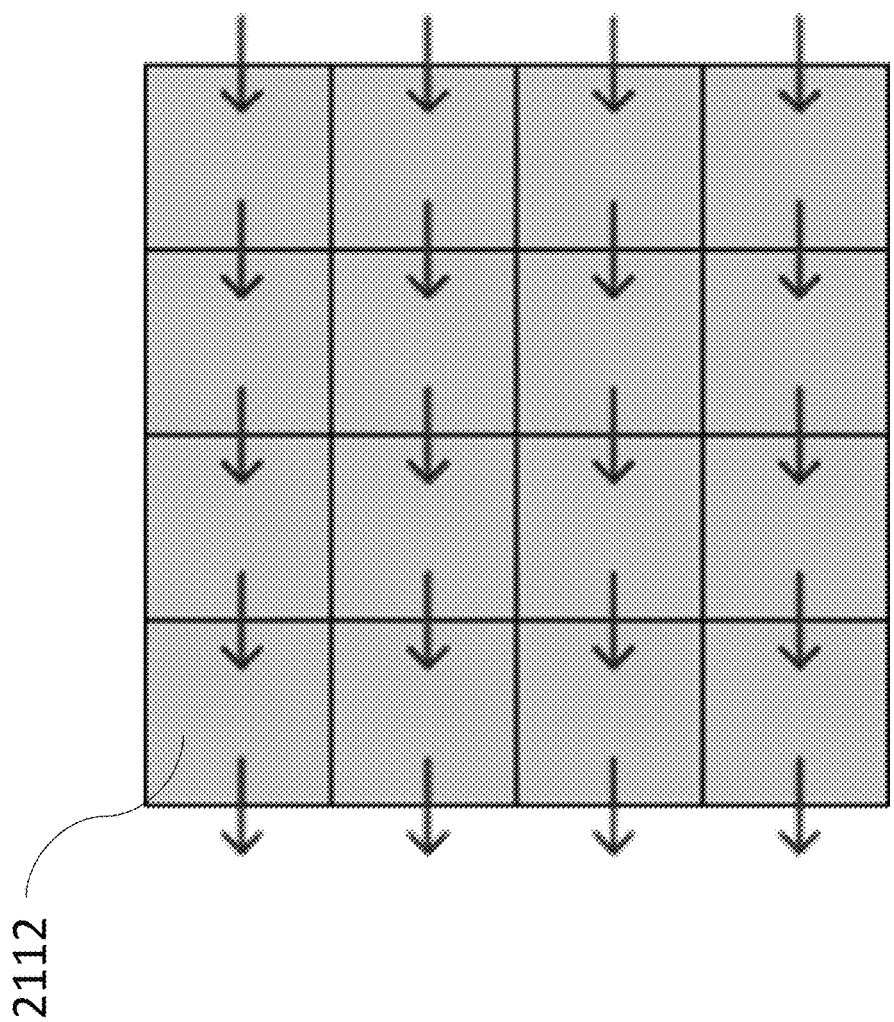

FIG. 10

METHODS FOR ENABLING IN-FIELD SELECTION OF NEAR-SENSOR DIGITAL IMAGING FUNCTIONS

CROSS-REFERENCE TO RELATED PATENT APPLICATION(S)

This application claims priority, under 35 U.S.C. § 119(e), to U.S. Application No. 62/565,511, which was filed on Sep. 29, 2017, and is incorporated herein by reference in its entirety.

GOVERNMENT SUPPORT

This invention was made with Government support under Grant No. FA8702-15-D-0001 awarded by the U.S. Air Force. The Government has certain rights in the invention.

BACKGROUND

An infrared focal plane array (IR FPA) is a camera system component typically comprised of integrated sensor and sensor interface integrated circuits (ICs). Together, the sensor and sensor interface IC transduce IR light into electrical signals for imaging, free-space optical communications, and other applications. An IR FPA may include some integrated data processing capability to analyze the imaging data prior to transferring the imaging data to other components of the camera system.

SUMMARY

Embodiments described herein include an imaging system that is comprised of a sensor array to acquire analog data, an analog sensor interface chip to convert the analog data to digital data, and a digital processor chip that receives the digital data as input. The digital processor can be substantially comprised of fixed circuitry (i.e., circuitry which cannot be reconfigured post fabrication), e.g., as in an application-specific integrated circuit (ASIC). The digital processor can be configurable prior to operation in the field. For example, it may be configured in fabrication with structured ASIC technology or may be implemented as a field programmable imaging array (FPIA). The digital processor can be additionally or alternatively programmable, such as in computer processor units (CPUs), graphic processor units (GPUs), and digital signal processors (DSPs).

An exemplary realization of an imaging system can include a three-chip stack: a sensor interface chip with a first side disposed on a first side of the sensor array chip, and a digital processor chip, such as an FPIA chip, with a first side disposed on a second side of the sensor interface chip. The FPIA chip can include a plurality of macropixel elements to receive and/or generate the digital data from the sensor interface chip and field programmable gate array (FPGA) elements, in electronic communication with the macropixel elements, to process the digital data.

An exemplary realization of a field programmable imaging array (FPIA) chip can include a substrate and macropixel elements, disposed on the substrate, to process digital data. Each macropixel element can include non-reconfigurable circuitry. The FPIA chip can also include field programmable gate array (FPGA) elements, disposed on at least a portion of the substrate and in electronic communication with the FPGA elements, to receive processed digital data from the macropixel elements.

Embodiments of an FPIA chip may include a substrate, a plurality of macropixel elements disposed on the substrate, and a plurality of FPGA elements disposed on at least a portion of the substrate in electronic communication with the plurality of FPGA elements. Each one of the macropixel elements includes non-reconfigurable circuitry. In operation, the macropixel elements process digital data, and the FPGA elements receive processed digital data from the plurality of macropixel elements.

The FPIA chip may include a plurality of reconfigurable interconnects, disposed on the substrate, to reconfigurably connect the plurality of macropixel elements to the plurality of FPGA elements. For instance, a first reconfigurable interconnect in the plurality of reconfigurable interconnects can be dynamically reconfigured to electronically couple at least one FPGA element to each macropixel element.

The FPIA chip may also include a plurality of deserializer elements, disposed on the substrate, to convert serial digital data from the plurality of macropixel elements to parallel digital data for processing by the plurality of FPGA elements. In this case, a second reconfigurable interconnect in the plurality of reconfigurable interconnects can be dynamically reconfigured to electronically couple at least one macropixel element in the plurality of macropixel elements to a first deserializer element in the plurality of deserializer elements. A third reconfigurable interconnect in the plurality of reconfigurable interconnects can be dynamically reconfigured to electronically couple at least one FPGA element in the plurality of FPGA elements to the first deserializer element.

The FPIA chip may also include a plurality of input/output (I/O) elements, disposed on the substrate, to at least one of receive a control signal or supply a signal output. A fourth reconfigurable interconnect in the plurality of reconfigurable interconnects can be dynamically reconfigured to electronically couple at least one FPGA element to a first I/O element in the plurality of I/O elements.

The FPIA can process data by processing digital data with the macropixel elements, transferring processed digital data from the macropixel elements to the FPGA elements, and reconfiguring connections between the macropixel elements and the FPGA elements. Reconfiguring connections between the macropixel elements and the FPGA elements may comprise connecting a first macropixel element to a first FPGA element at a first time step and connecting the first macropixel element to a second FPGA element at a second time step. This method may include converting serial digital data from the macropixel elements to parallel digital data for processing by the FPGA elements. A first macropixel element can be reconfigurably coupled to a deserializer element that converts the serial digital data to parallel digital data. If desired, the deserializer element can be reconfigurably connected to a first FPGA element. The first FPGA element can be reconfigurably connected to an input/output (I/O) element. And the I/O element can receive a control signal and/or supplying a signal output.

Other embodiments include an apparatus that comprises a sensor array chip, a sensor interface chip having a first side disposed on a first side of the sensor array chip, and a digital processing chip, such as an FPIA chip, having a first side disposed on a second side of the sensor interface chip. In operation, the sensor array chip generates analog data. The sensor interface chip converts the analog data to digital data. And the digital processing chip processes the digital data provided by the sensor interface chip.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTION OF DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 7A is an illustration of CSTs arranged as a three-dimensional array.

FIG. 8A is an illustration of the relationship between 3D pixel inputs and CSTs in a first operating mode of an FPIA.

FIG. 9A is an illustration detailing serial data transfer between CSTs in the same slice within a single macropixel element under a pixel shift left command.

FIG. 10 is a block diagram detailing the integration of macropixel elements with various FPGA elements, power, and inputs/outputs.

DETAILED DESCRIPTION

ROICs have been designed for use with particular types of imaging devices including digital focal plane arrays (DFPAs), Geiger-mode avalanche photodiodes (GM-APDs), and passive infrared (IR) image sensors. While each type of ROIC may be used for integration with one or more types of photodetector arrays, typically a particular ROIC provides better performance for some photodetector arrays than others. ROIC designs may also vary depending on the application, which may have requirements and/or performance parameters specific to the particular application. For an IR FPA, some exemplary requirements and/or performance parameters may include a particular camera frame rate, shutter speed, integrated data processing requirement, or sensitivity to a particular wavelength of light. ROICs are typically designed for use in a few specific applications, making them less suitable for other applications.

Figure 1A:
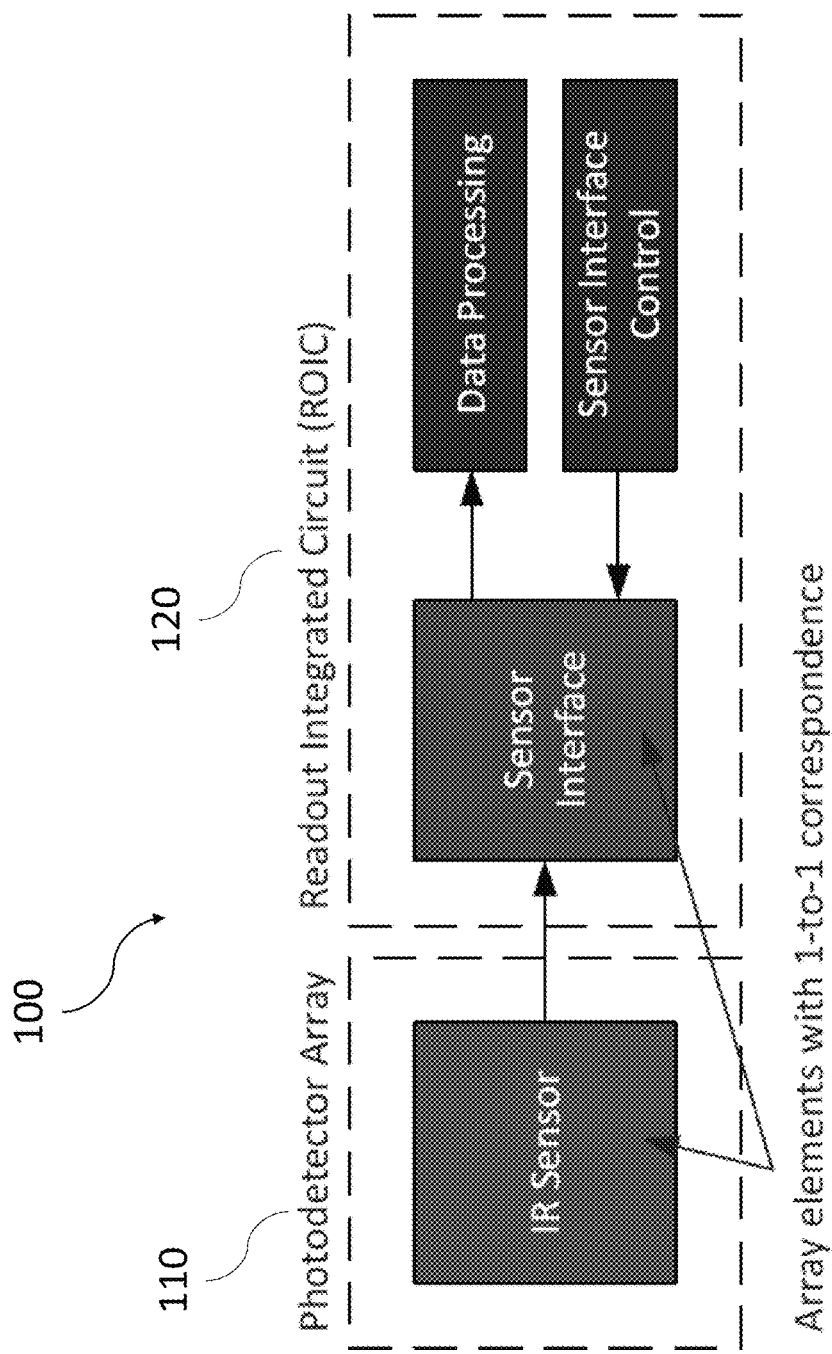
FIG. 1A is a block diagram of a conventional readout integrated circuit (ROIC) coupled to an infrared (IR) focal plane array (FPA).

FIG. 1A shows a high-level block diagram of an IR FPA 100. The IR FPA 100 includes a photodetector array 110, which is typically implemented as a standalone integrated circuit. To support the operation of the photodetector array 110, other circuitry for data processing is typically disposed onto a separate integrated circuit referred to as a readout integrated circuit (ROIC) 120, which is electrically coupled to the photodetector array 110 during operation. The ROIC 120 typically includes a sensor interface and sensor interface control, where the sensor interface may be implemented as analog circuitry, digital circuitry, or a mix of the two while data processing and/or the sensor interface control is typically all digital logic.

Figure 1B:
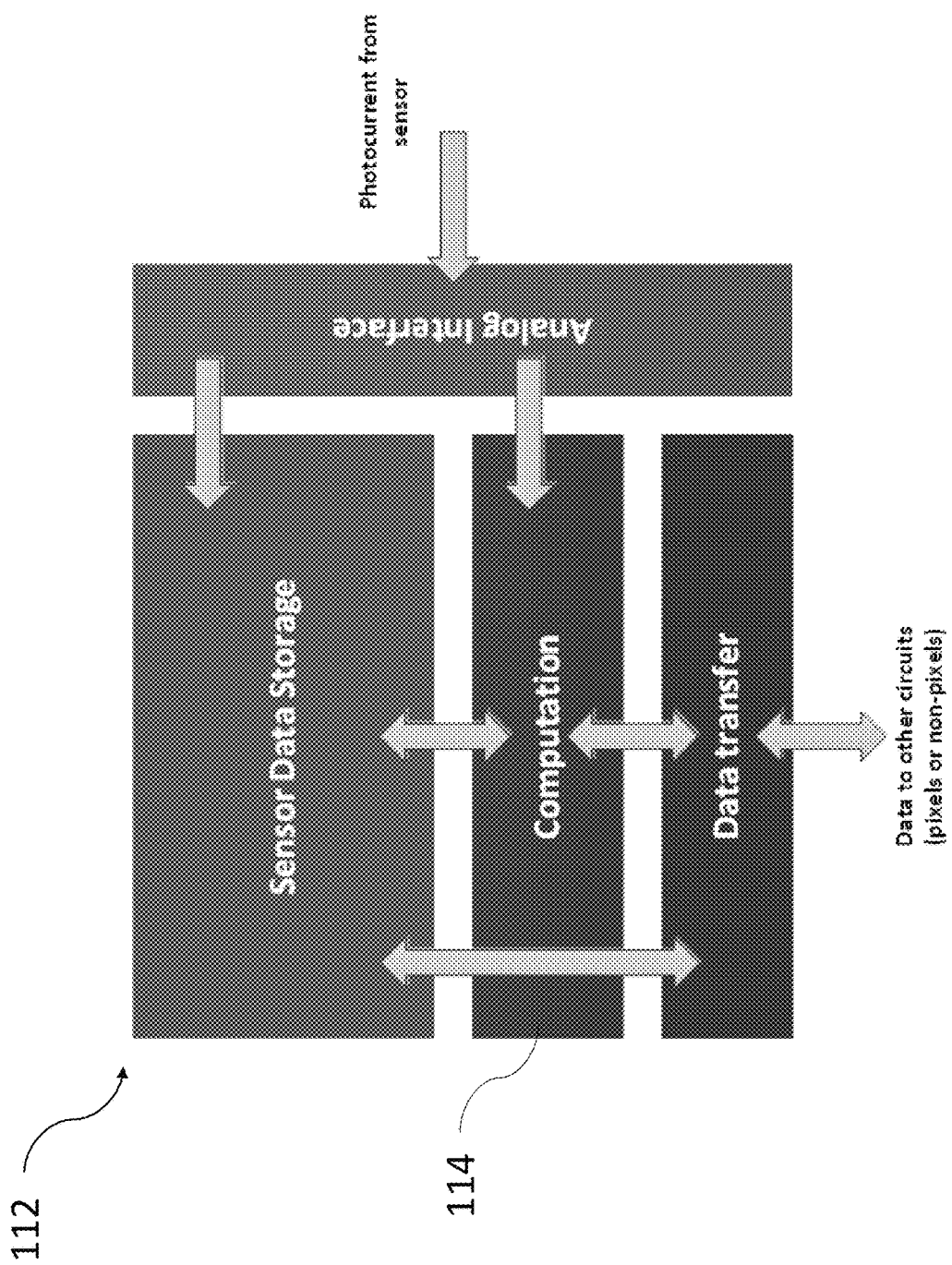
FIG. 1B is a block diagram detailing a sensor interface circuit in the ROIC of FIG. 1A that is coupled to one sensor in a sensor array.

FIG. 1B shows a block diagram for a conventional sensor circuit 112 in the ROIC 120 used to manage data transfer and processing of a single sensor (e.g., a pixel) in the photodetector array 110. The ROIC 120 typically includes an array of such sensor circuits 112. The arrows in FIG. 1B correspond to the possible dataflows in the sensor circuit 112; however, in practice, only a subset of the dataflows is used. The sensor circuit 112 typically includes a computation block 114, which is comprised of integrated circuitry to process data. The computation block 114 in conventional sensor circuits 112, however, is typically constrained in design and capability by the lack of physical space for circuitry support the computation block 114.

Furthermore, the specialized nature of ROICs limits their ability to adapt during operation. Typically, a ROIC may support a few modes of operation, which are defined prior to fabrication. If new modes of operation are desired, a new ROIC must be designed and fabricated, which can be a lengthy and expensive process. Therefore, it is highly desirable to have an integrated circuit capable of meeting the requirements and/or performance parameters of various applications while allowing for new operational modes post fabrication.

One approach towards enabling circuitry capable of defining new modes of operation post fabrication is the use of a field programmable gate array (FPGA). An FPGA is an integrated circuit comprised, at least in part, of reconfigurable, general-purpose logic elements called lookup tables and reconfigurable, general-purpose input/output (I/O) that are connected to one another through a reconfigurable switch network. New operational modes may be defined in the FPGA via software, which is typically customized to support the end use application of the FPGA. The software captures a user's intended configuration of the FPGA logic and switch network and loads the configuration onto the FPGA prior to operation.

Figure 2:
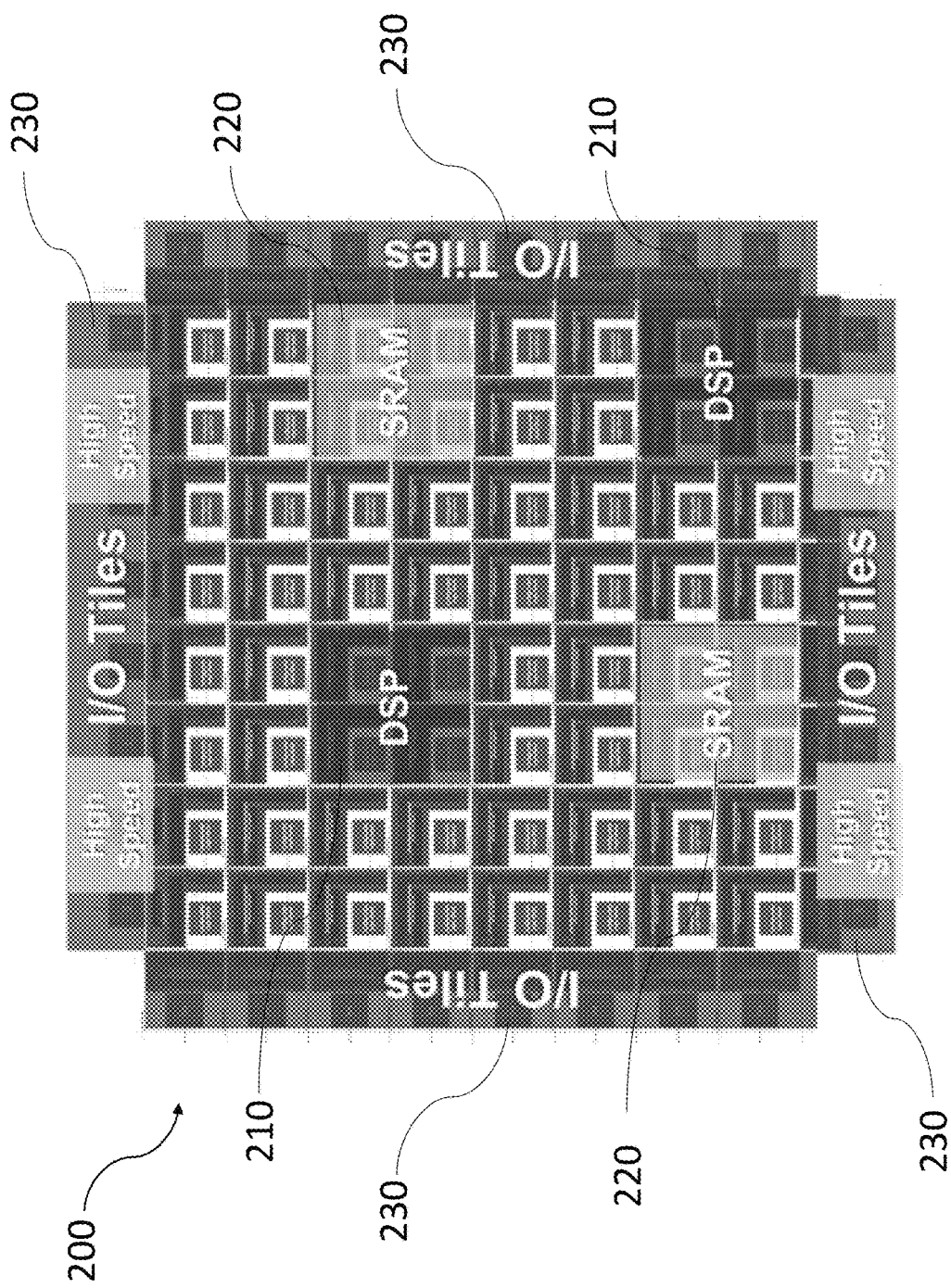
FIG. 2 is a block diagram of a field programmable gate array (FPGA).

The fundamental circuit elements of the FPGA (i.e., the lookup tables and the reconfigurable switch network) provide some level of processing capability, which can support operation of an imaging device. To enable greater processing capability, FPGAs have been previously developed to include integration of other non-reconfigurable circuitry. FIG. 2 shows an exemplary FPGA chip 200 that includes circuitry for digital signal processing (DSP) 210, memory 220, and I/O elements 230. Other exemplary FPGAs having non-reconfigurable circuitry including microprocessor cores and analog-to-digital converters.

Historically, the non-reconfigurable circuitry integrated into FPGAs have provided only general-purpose functionality (e.g., arithmetic, memory, etc.) to allow the FPGA to remain agnostic to the end user application. Specialized circuitry for use in imaging systems typically remains on the ROIC. Thus, an FPGA is typically paired with a ROIC to augment the ROIC data processing capability. Additionally, FPGAs typically don't include circuitry with a fixed physical location since the configuration of the FPGA is primarily software driven. In contrast, a ROIC typically includes a sensor interface, which provides connections physically positioned to couple to sensory elements of the photodetector array.

A Three-Chip Stack with a Digital Processor

A field programmable imaging array (FPIA) addresses the shortcomings of conventional ROICs and FPGAs. An FPIA includes ROIC sensor interface circuitry and FPGA circuitry to enable post-fabrication definition of ROIC operational modes. This combination offers several unique features, including (1) reconfigurable sensor interface elements; (2) reconfigurable connectivity between the sensor array and the sensor interface array; (3) integration of sensor interface elements and FPGA circuitry on a single integrated circuit; and (4) interleaving fixed connectivity of subcircuits with reconfigurable connectivity of subcircuits. This FPIA can be mated to a sensor interface chip, which in turn is mated to a sensor chip, to form a three-chip imaging system.

Figure 3:
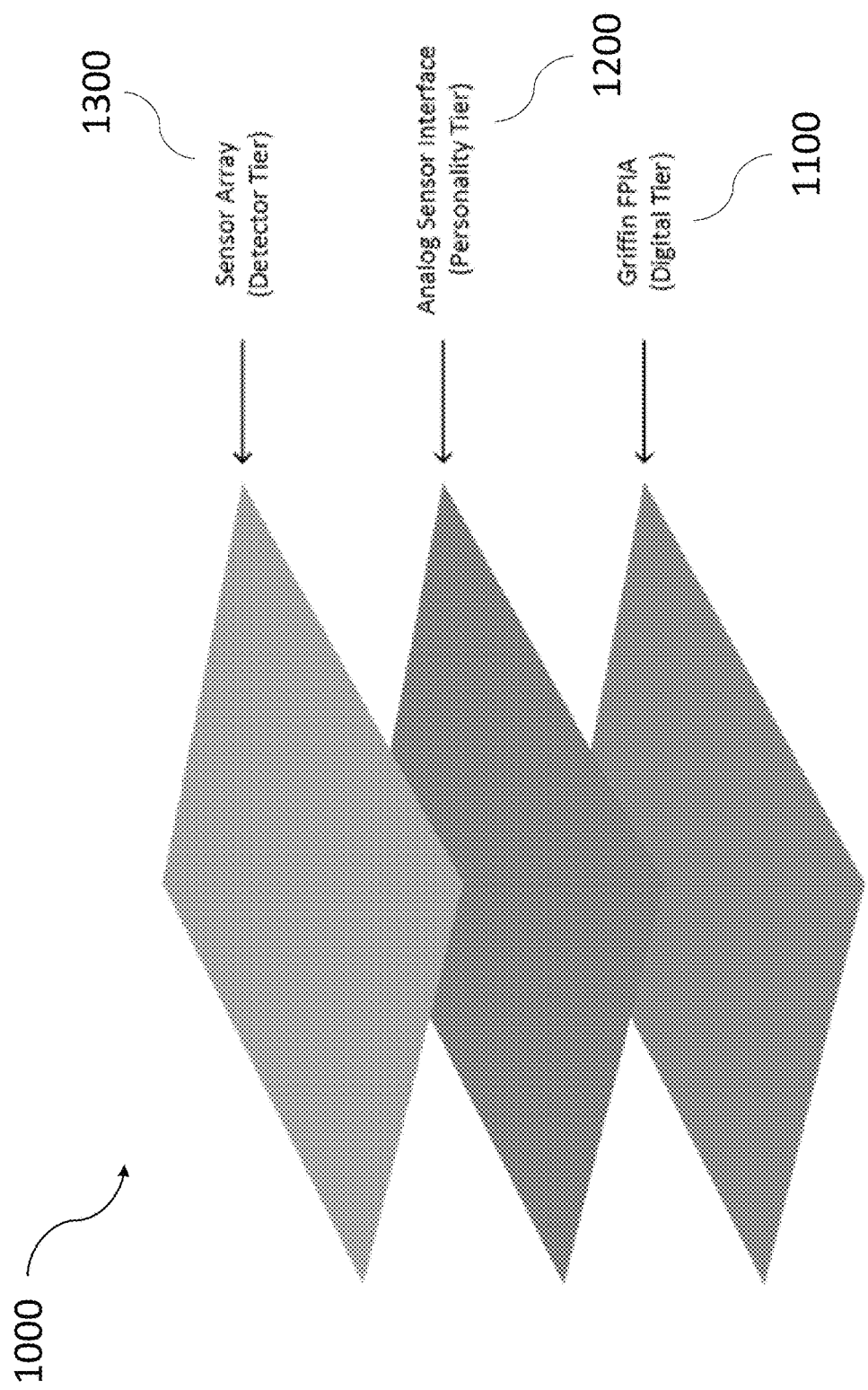
FIG. 3 is an illustration detailing the integration of a field programmable imaging array (FPIA) with a sensor array and an analog sensor interface.
Figure 4A:
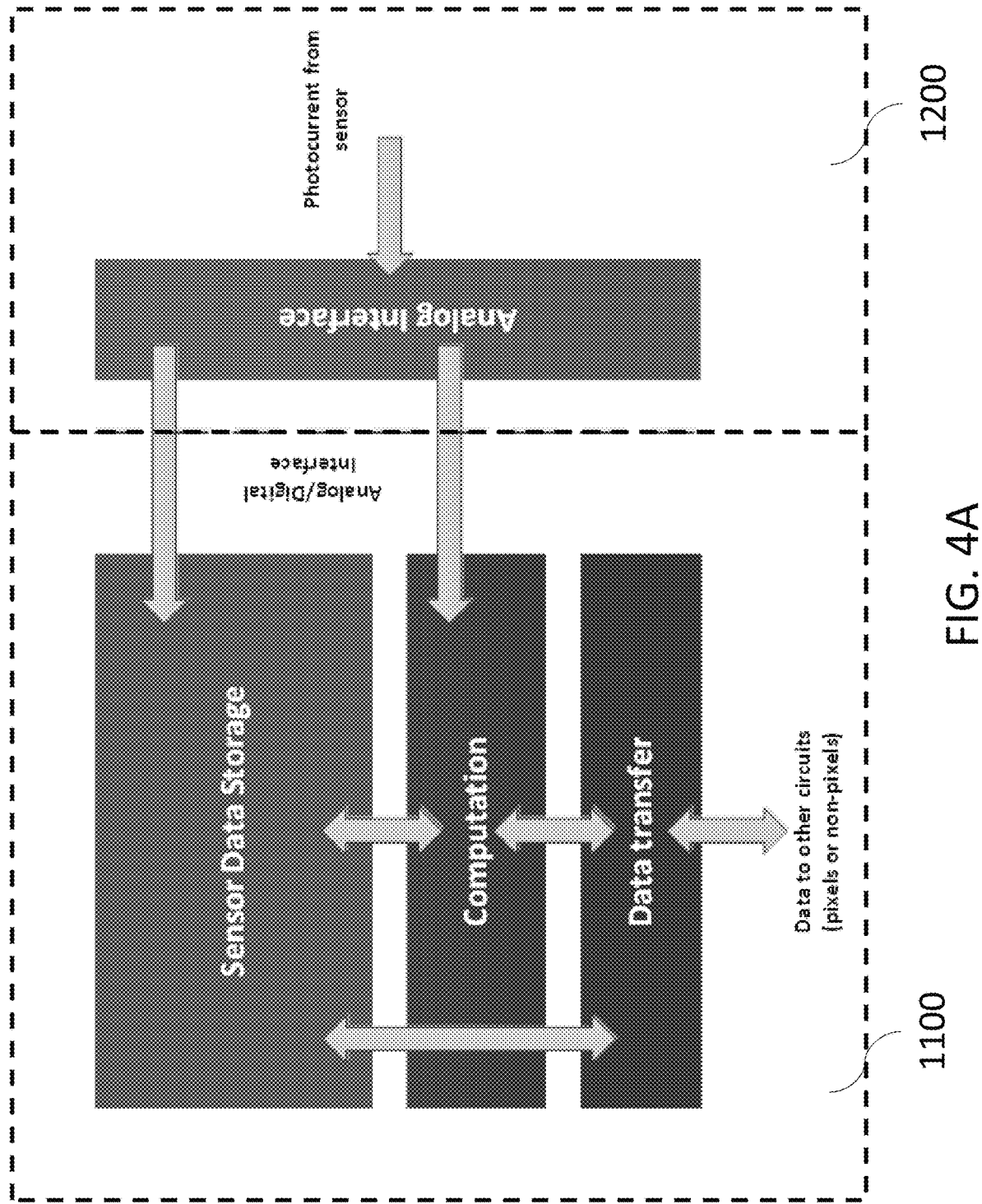
FIG. 4A is a block diagram detailing the partitioning of various functionality in a sensor circuit between a digital processor and an analog sensor interface chip according to a first example.
Figure 4B:
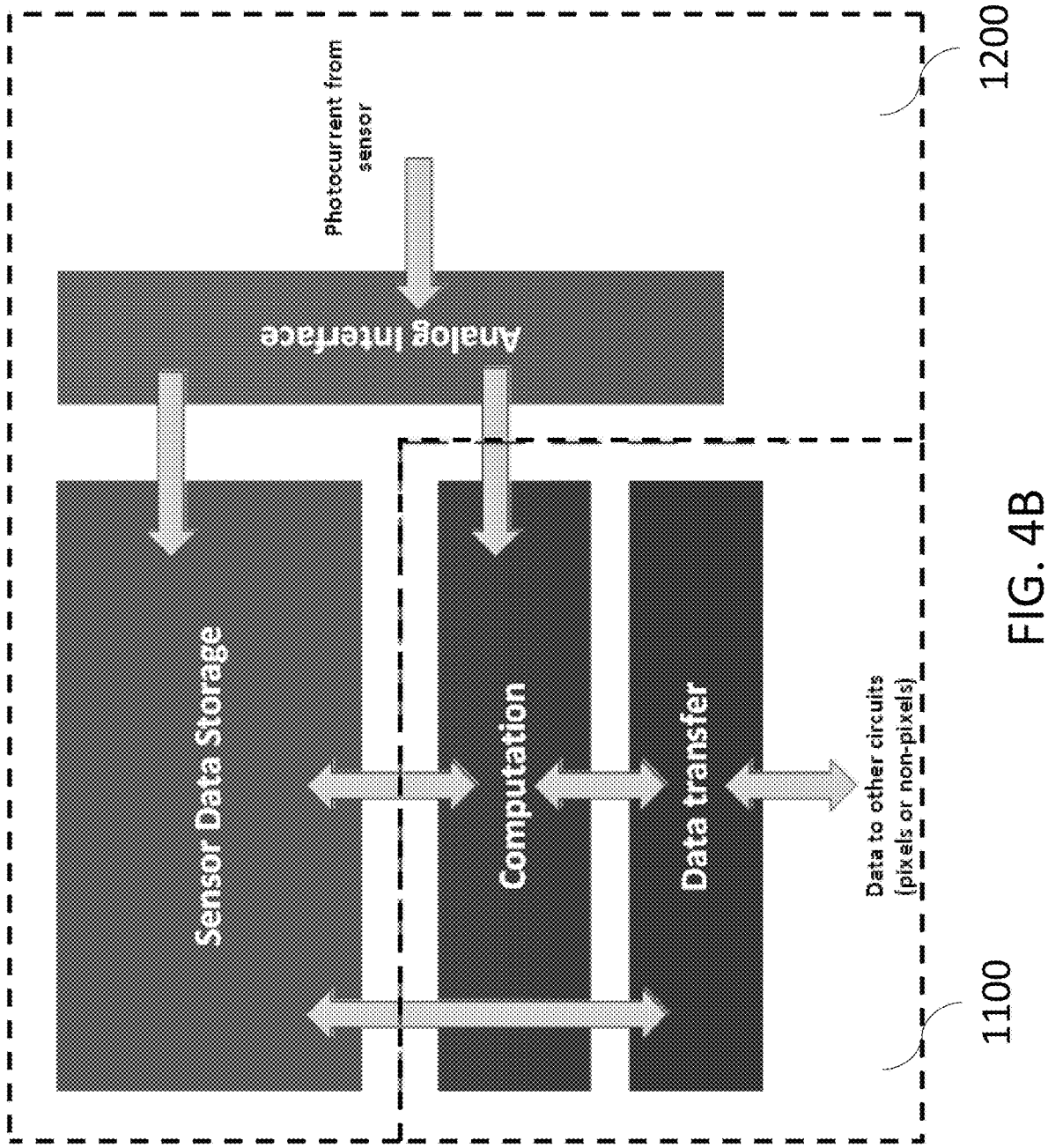
FIG. 4B is a block diagram detailing the partitioning of various functionality in a sensor circuit between a digital processor and an analog sensor interface chip according to a second example.

FIG. 3 shows an example three-chip imaging system 1000. It includes a digital processor 1100, such as an FPIA, coupled to an analog sensor interface chip 1200, which is disposed between the digital processor 1100 and a sensor array chip 1300. The digital processor 1100, sensor interface chip 1200, and sensor array chip 1300 can be connected to each other via bond pads of a general-purpose input/output and pixel inputs. The analog sensor interface chip 1200 may be used to convert analog data from the sensor array 1300 into digital data for input into the digital processor 1100 while the digital processor 1100 performs computation, data transfer, and data storage, as illustrated in FIG. 4A. In some instances, the analog sensor interface chip 1200 may provide both analog-to-digital conversion and data storage, allowing the digital processor 1100 to provide more computation and data transfer functionality, as illustrated in FIG. 4B.

In this manner, the functionality of the sensor circuit 112 in FIG. 1B may be partitioned into two chips: the digital processor 1100 and the analog sensor interface chip 1200. Separating the functions of the sensor circuit 112 into two chips increases the thickness of the imaging system 1000 but enables the digital processor 1100 to provide greater processing capability compared to the computation block 114 in the sensor circuit 112. Additionally, the use of a separate digital processor 1100 allows for greater flexibility in manufacturing since regulations governing the manufacture of the analog interface and the sensor are now decoupled from the processing capability provided by the digital processor 1100.

The digital processor 1100 may be various types of integrated circuitry with varying levels of reconfigurability. For example, the digital processor 1100 may be an application-specific integrated circuit (ASIC). The ASIC may include but is not limited to circuitry for one or more counters (e.g., to compute a running sum of digitized photocurrent accumulated over time), one or more timers (e.g., to record when photocurrent is detected with a circuit that functions like a stopwatch), and one or more controllers (e.g., to decide when to sense photocurrent and when not to). In this example, the ASIC may be comprised of fixed circuitry (i.e., circuitry which cannot be reconfigured post fabrication). The operating modes of the ASIC are thus defined pre-fabrication and subsequent use of the ASIC is based on one or a combination of the operating modes to supper the operation of an imaging system.

In another example, the digital processor 1100 may be a structured ASIC. The structured ASIC provides a design for a digital processor 1100 comprised of a set of circuit elements that may be customized depending on the application. The circuit elements may include but are not limited to one or more macropixel elements to interface with and receive digital data from the analog sensor interface chip 1200, one or more deserializer elements to convert serial digital data from the macropixel elements to parallel digital data for subsequent processing, memory elements, and digital signal processing elements. The circuit elements may be laid out onto a substrate (e.g., a silicon wafer) without a complete set of wires connecting all circuit elements. An end user may use computer-aided design methods to define the connecting wires for an application, thus fixing the electronic coupling between circuit elements prior to fabrication.

In this manner, the structured ASIC may be not reconfigured post fabrication like an FPGA, but rather the structured ASIC is mask reconfigurable based on the design and fabrication of the structured ASIC.

In another example, the digital processor 1100 may be various types of computer processor units (CPUs), graphic processor units (GPUs), and digital signal processors (DSPs). In this example, the digital processor 1100 may be programmable (as opposed to reconfigurable like an FPGA) by writing a software program in a language that can be compiled into a sequence of processor instructions. The digital processor 1100 may include customized circuitry to enable the digital processor 1100 to interface with the analog sensor interface chip 1200.

Field-Programmable Imaging Arrays (FPIAs)

As mentioned above, the digital processor 1100 may be an FPIA, which is an integrated circuit that combines customized ROIC sensor interface circuitry with FPGA circuitry to enable post-fabrication definition of ROIC operational modes. The FPIA chip may include both fixed logic resources suitable for use in imaging applications and reconfigurable logic resources such as those found in conventional FPGA chips on a single die, which are integrated together via a reconfigurable switch network.

The FPIA chip may be reconfigured in a similar manner to a conventional FPGA. For example, a bitstream may be loaded via a joint test action group (JTAG) port 2500 into configuration registers on the FPIA chip to initialize operation of the FPIA chip. The bitstream represents a user-defined model of the FPIA chip designed via software and then translated into a set of instructions for use in configuring the various electronic elements of the FPIA chip. The bitstream may include one or more operating modes that can be subsequently switched during operation of the FPIA chip automatically or with user intervention. New operating modes may be defined by loading a new bitstream into the FPIA chip. In another example, the bitstream may be configured to enable users to define operating modes once the bitstream is loaded. This may be accomplished by sending instructions (e.g., opcodes) that replace, at least in part, a previous operating mode of the FPIA chip. Operating modes may even be changed and/or defined during data acquisition. In yet another example, the inputs/outputs to and from the FPIA chip may be leveraged to change and/or define new operating modes. This can be accomplished based on the particular configuration used for the FPIA chip, which may allow the inputs/outputs to be used for such purposes.

In this manner, the FPIA chip may be (1) compatible with various types of sensor arrays, (2) able to meet the requirements and/or performance parameters of various applications without having to use a separate ROIC by including circuitry tailored for imaging applications, and (3) reconfigurable such that new operating modes may be defined post fabrication. Operating modes may include, but are not limited to passive imaging, in which a light intensity is measured by staring at a scene and gradually collecting photons (integrating intensity), and active imaging, of which laser detection and ranging (LADAR)/light detection and ranging (lidar) is a well-known example. In the case of active imaging, a light source, such as a laser, is used to generate reflections from a scene, and the time between light emission and detection is measured. The FPIA chip disclosed herein may be used in several applications including, but not limited to self-driving vehicles where various types of imaging data collected by the vehicle may be changed on the fly or collected concurrently, laser detection and ranging (LADAR), laser communications, wide-area surveillance, and other applications where optical, infrared, or radio frequency (RF) imaging systems are used.

Figure 5A:
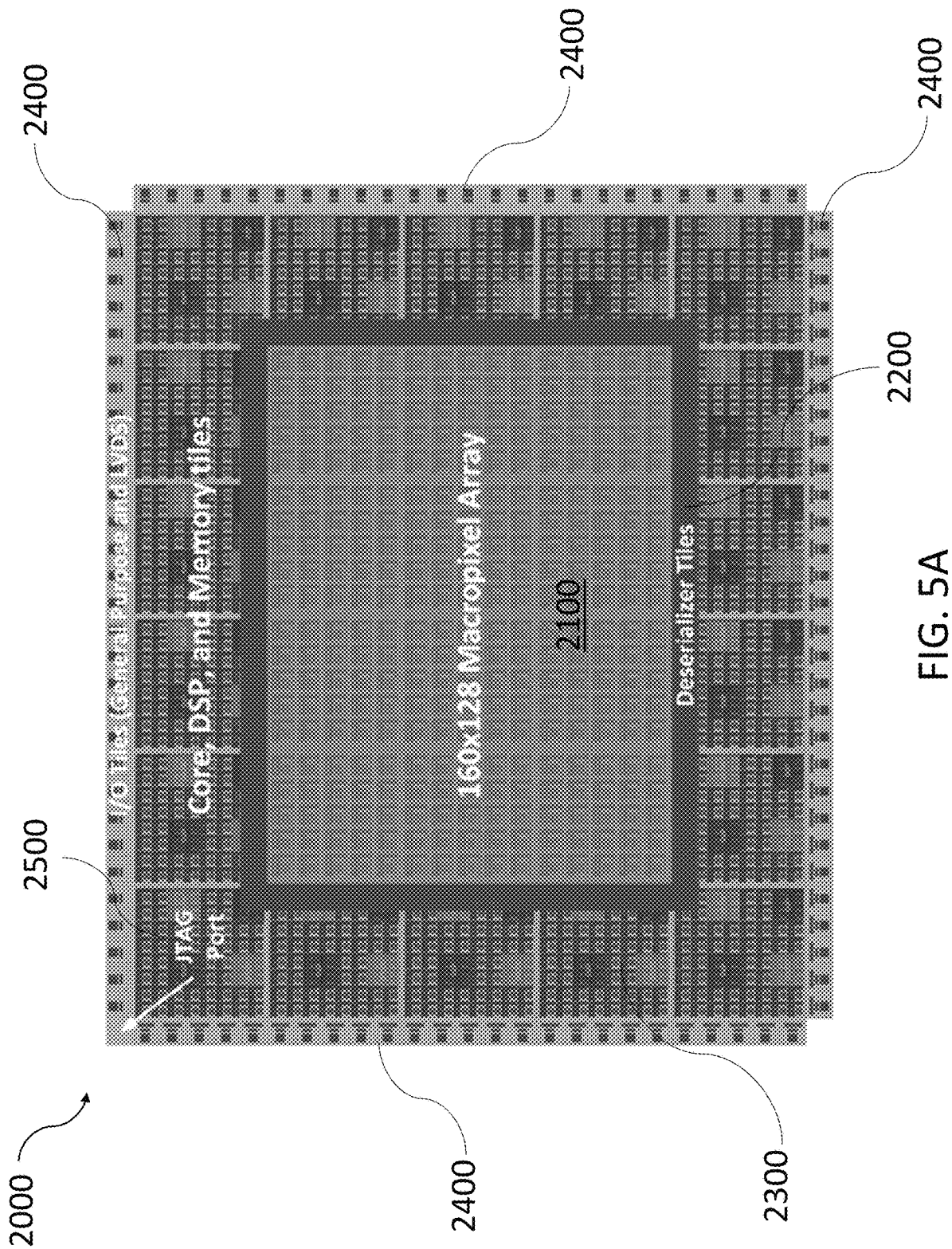
FIG. 5A is a diagram of an exemplary FPIA chip.

A representative block diagram for an exemplary FPIA chip 2000 is shown in FIG. 5A. The FPIA chip 2000 is intended to be used with a sensor array chip (not shown), comprising a two-dimensional array of sensors (e.g., pixels). The FPIA chip 2000 may include one or more macropixel elements 2100 to provide digital data on a per sensor basis and high-bandwidth transfer of the digital data between macropixel elements 2100 for subsequent processing by other circuit elements of the FPIA chip 2000. In some instances, the FPIA chip 2000 may also include one or more deserializer elements 2200 electronically coupled to the macropixel elements 2100 to convert serial data from the macropixel elements 2100 to parallel data for subsequent processing. The FPIA chip 2000 may also include various types of FPGA elements 2300 electronically coupled to the macropixel elements 2100 and/or the deserializer elements 2200. The FPGA elements 2300 may include: one or more general-purpose FPGA elements 2320 to provide customizable functionality that may be reconfigured via software, one or more digital signal processing (DSP) FPGA elements 2340 to provide signal processing of the data, and one or more memory FPGA elements 2360 to temporarily store data and/or other signals. At the periphery of the FPIA chip 2000, one or more input/output (I/O) elements 2400 may be disposed to provide an interface between the contact pads of the FPIA chip 2000 (sites where the FPIA chip 2000 connects to other electronic devices) and the FPGA elements 2300. Various types of I/O elements 2400 may be used including general-purpose I/O (GPIO) elements 2420 and low voltage differential signaling (LVDS) I/O elements 2440 for high-speed data transfer.

Figure 5B:
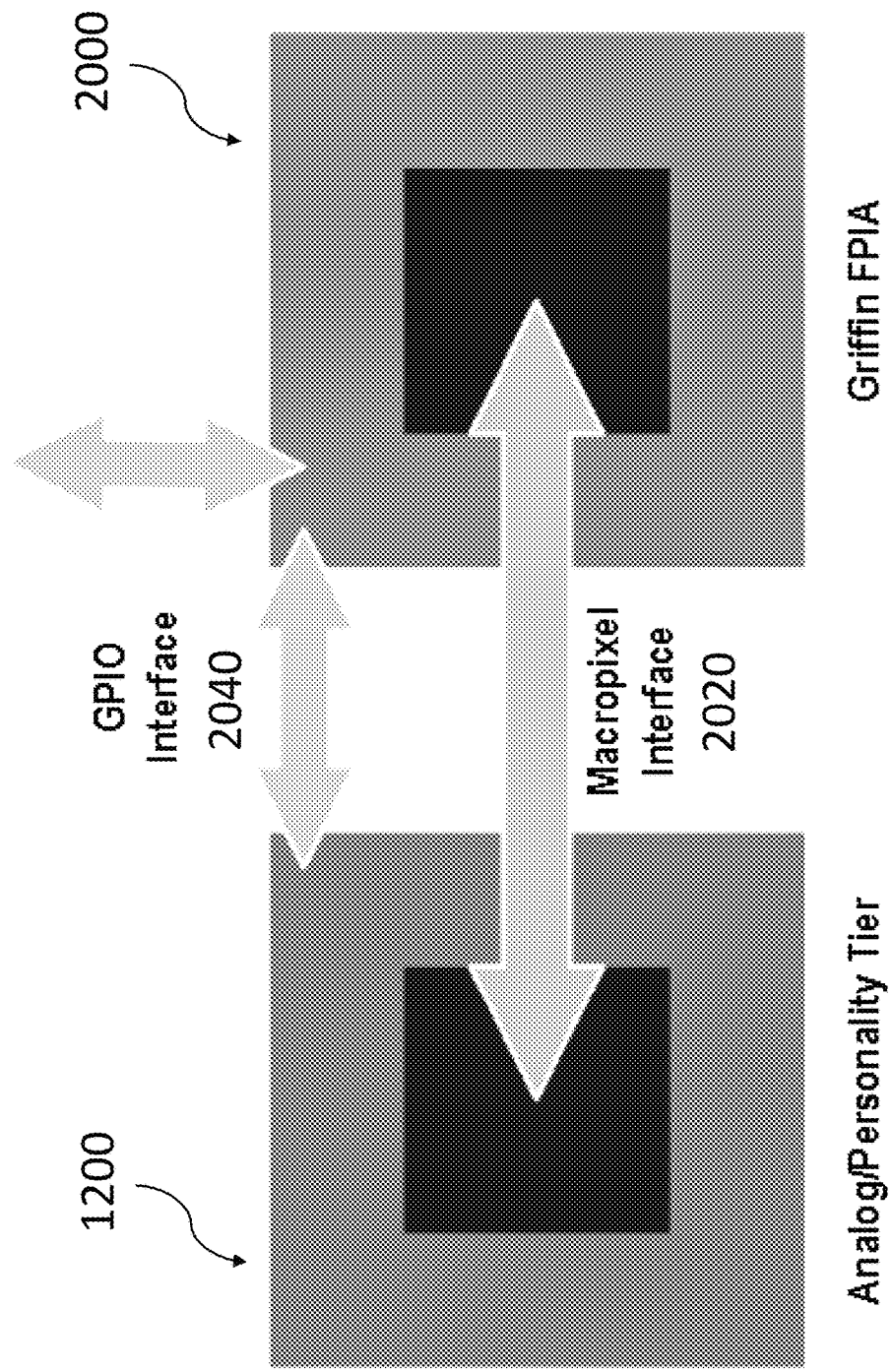
FIG. 5B is an illustration detailing the interface between the FPIA chip of FIG. 5A and an analog sensor interface.

The FPIA chip 2000 may be configured to couple to an analog sensor interface chip 1200, which provides digital data to the FPIA chip 2000 by converting analog data from the sensor array chip into digital data. As shown in FIG. 5B, several interfaces with the analog sensor interface chip 1200 may be utilized to support the operation of the FPIA chip 2000. For instance, a macropixel interface 2020 may be used to facilitate I/O between the macropixel elements 2100 of the FPIA chip 2000 and corresponding connections on the analog sensor interface chip 1200. The I/O relationships defined by the macropixel interface 2020 may include but are not limited to digitized detector event pulses and other signals that are generated by the analog sensor interface chip 1200 on a per sensor or a per macropixel basis.

FIG. 5B also shows the FPIA chip 2000 may include a GPIO interface 2040. The GPIO interface 2040 may be used to define a set of primary inputs and outputs for a particular application, which may vary depending on the design of the sensor array chip. These inputs and outputs may include but are not limited to: sensor array chip control inputs, status monitor outputs, data busses, camera system interfaces, and any combinations of the foregoing. In some instances, the GPIO interface 2040 may utilize both GPIO elements 2420 and LVDS I/O elements 2440. The GPIO interface 2040 may also allow transmission of signals that are distributed only to the FPIA chip 2000 or shared between the FPIA chip 2000 and the analog sensor interface chip 1200 via 3D integration.

Macropixel Elements

Figure 6A:
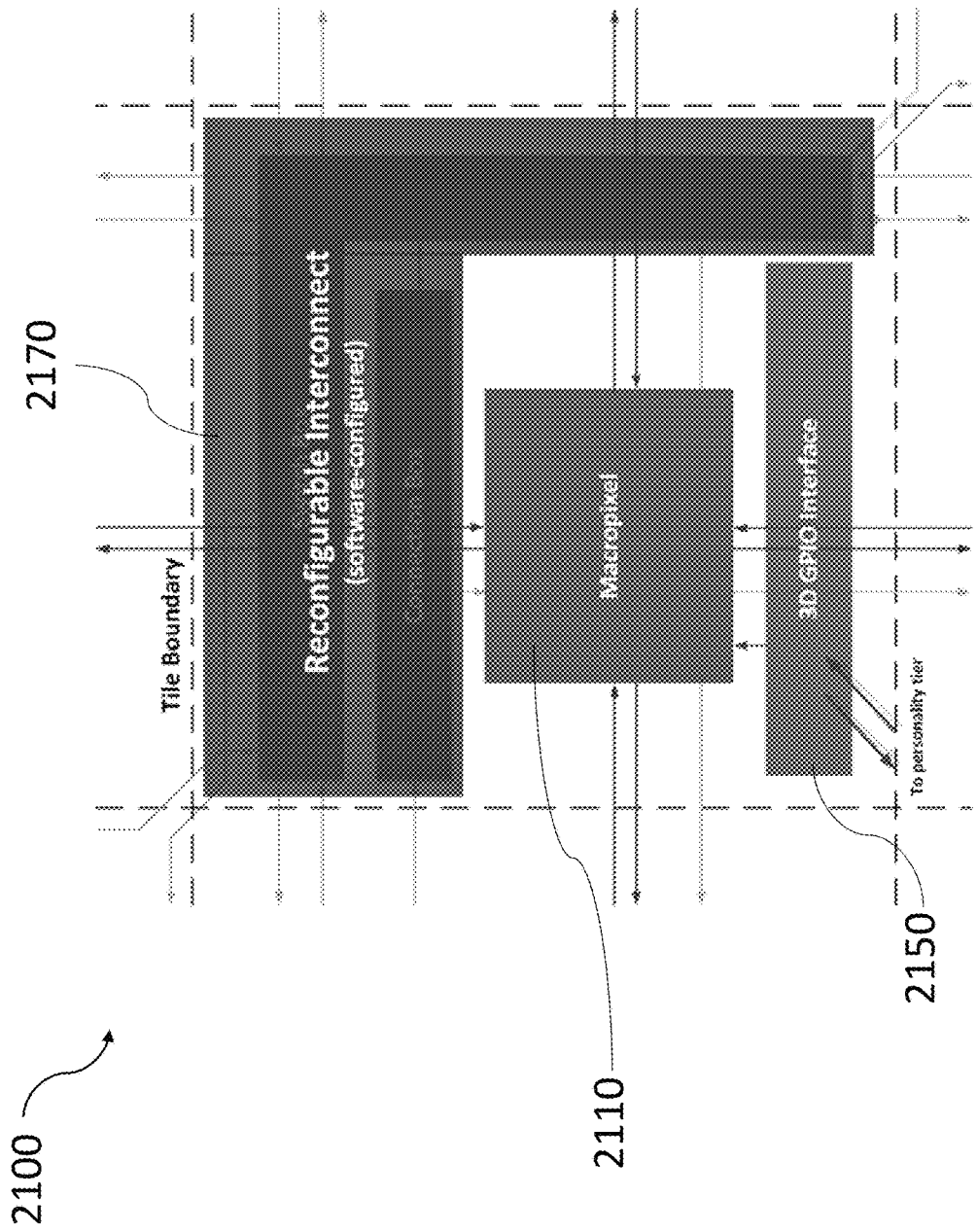
FIG. 6A is a tile block diagram of a macropixel element.

FIG. 6A shows a representative tile block diagram for a single macropixel element 2100 in an FPIA. Each macropixel element 2100 may be comprised of a primary logic block 2110 to manage the transfer and processing of digital data, one or more general-purpose input pins 2140 (also referred to herein as "3D pixel inputs") to receive digital data from the analog sensor interface chip 1200 (FIG. 3), one or more general-purpose input/output pins 2150 (also referred to herein as "3D GPIO") to interface with the analog sensor interface chip 1200, at least one fixed interconnect to allow for orthogonal shifting between adjacent macropixel elements 2100, and a reconfigurable interconnect 2170, which may be controlled via software (e.g., electronic design automation (EDA) tools). Inputs/outputs may be transferred using either reconfigurable or non-reconfigurable interconnects.

Each 3D pixel input 2140 may correspond to a single sensor in the sensor array. Thus, each macropixel element 2100 may receive digital data corresponding to a plurality of sensors in the sensor array. For example, the FPIA chip 2000 may include a 160 by 128 array of macropixel elements 2100 where each macropixel element 2100 receives data from an 8 by 8 array of sensors. Thus, the FPIA chip 2000 can support a 1280 by 1024 sensor array.

The processing performed by the primary logic block 2110 includes but is not limited to integrating the light intensity (e.g., photon counting), timestamping event arrivals (e.g., a digital stopwatch function), and basic arithmetic operations (e.g., add, multiply, subtract, divide, square root, trigonometric functions) for at least one macropixel element 2100. Processing may also be performed utilizing data from multiple macropixel elements (e.g., arithmetic operands may utilize data from more than on macropixel elements 2100 as inputs).

Control of the macropixel element 2100 may be primarily software driven through use of software commands (also referred to herein as "opcodes"). The use of software control allows the macropixel element 2100 to be more application-agnostic whereas, by comparison, hardware control may impose hardware constraints on the FPIA chip 2000, thus restricting the use of the macropixel element 2100 to a particular application. The opcodes may be used to control an array of counter-shifter-timer (CST) circuits 2112 in the primary logic block 2110 and its supporting circuitry. The opcodes may constitute a variety of operation and control commands including, but not limited to selecting the computational operation of the CST circuit 2112, programming of the CST circuit 2112 clocking circuitry and other control registers, controlling the data multiplexers of the macropixel element 2100, and managing the relationship between the 3D GPIO 2150 and CST circuit 2112 in the macropixel element 2100.

Figure 6B:
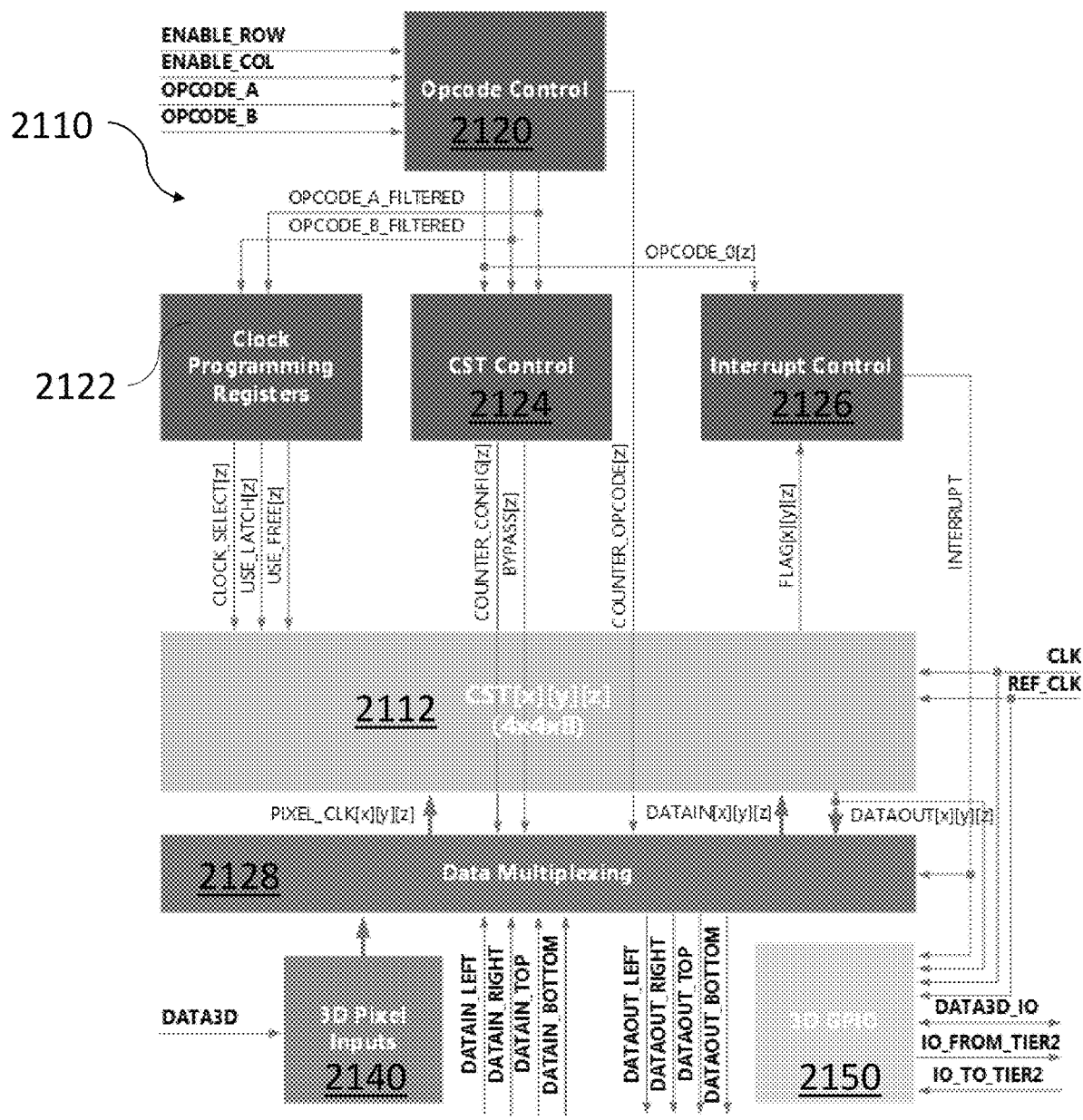
FIG. 6B is a circuit block diagram of the macropixel element of FIG. 6A.

FIG. 6B shows a more detailed circuit diagram of the primary logic block 2110 of the macropixel element 2100 with connections to the 3D pixel inputs 2140 and the 3D GPIO 2150. The 3D pixel inputs 2140 and the 3D GPIO 2150 may be coupled, at least in part, to one or more reconfigurable interconnects to interface with the analog sensor interface chip 1200. The CST circuit 2112 represents the portion of the primary logic block 2110 that performs arithmetic operations on the digital data, such as addition, subtraction, inversion, and shifting operations.

Figure 6C:
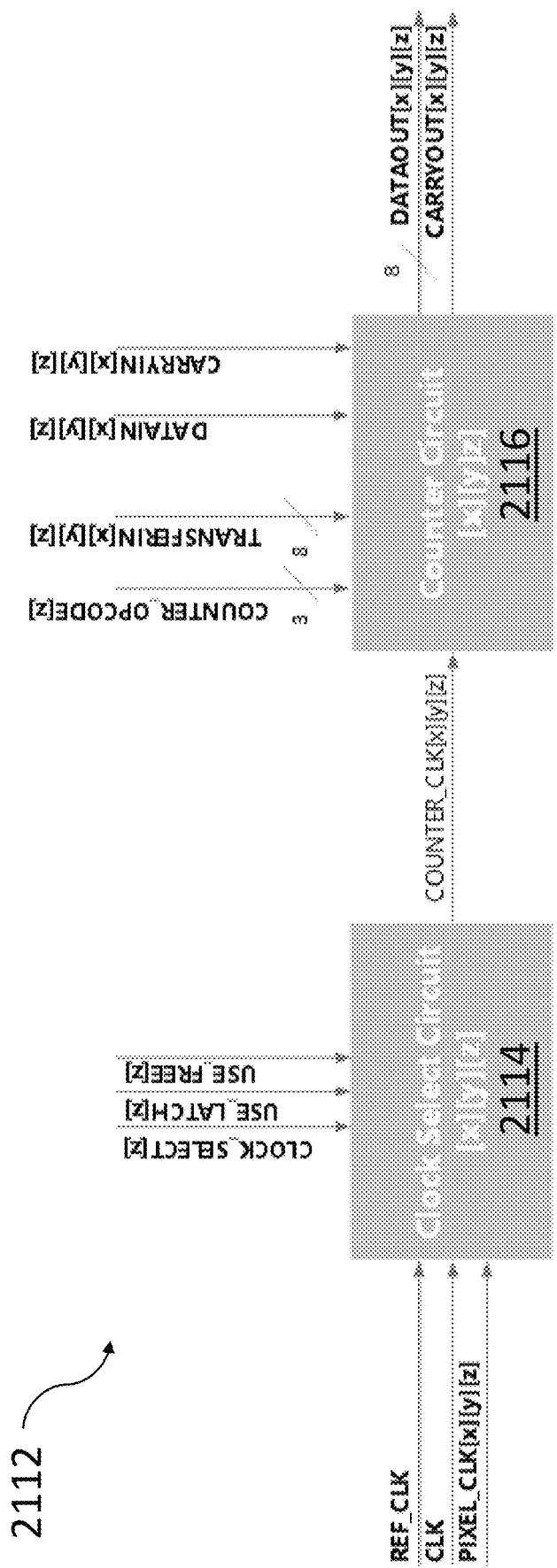
FIG. 6C is a circuit block diagram of the Counter-Shifter-Timer (CST) block of FIG. 6B.

As shown in FIG. 6C, the CST circuit 2112 may be comprised of a clock select circuit 2114 and a counter circuit 2116. The clock select circuit 2114 may receive inputs from a clock programming register 2122 to generate a clock (e.g., a signal used to coordinate processes executed by various circuitry so as to enable a more predictable, reliable outcome) to be used when executing processes with the counter circuit 2116.

The FPIA chip 2000 may generally support several clocks to support different processes that may be executed at varying frequencies. Generally, the FPIA chip 2000 may support clock frequencies up to at least about 1000 MHz. The counter circuit 2116 may receive as input digital data from a data multiplexer 2128 and an opcode from an opcode control circuit 2120, which provides instructions on the process to be applied to the digital data. The counter circuit 2116 may then execute the arithmetic operation (exemplary examples of which are mentioned above) on to the digital data, which may then be passed back to the data multiplexer 2128 as output.

FIG. 6B also shows the primary logic block 2110 may include an opcode control circuit 2120 to manage how opcodes are transmitted to different portions of the primary logic block 2110. These portions may include the clock programming register 2122, a CST control 2124, an interrupt control 2126, and the data multiplexer 2128. The opcode control circuit 2120 may receive, as input, opcodes and the index of a particular CST circuit 2112 from the reconfigurable interconnect 2170.

The clock programming register 2122 is comprised of circuitry to facilitate the selection of different clocks via at least one opcode from the opcode control circuit 2120, which may then be passed as input to the CST circuit 2112, as described above.

The CST control 2124 is comprised of circuitry to manage the relationship between the 3D pixel inputs 2140 and the CST circuit 2112 based on at least one opcode from the opcode control circuit 2120. As described above, each 3D pixel input 2140 may correspond to a sensor in the sensor array. The CST control 2124 can assign the 3D pixel inputs 2140 to different CST circuits 2112 in a three-dimensional array of CST circuits 2112 to affect how the digital data received by the 3D pixel inputs 2140 is processed.

Figure 7A:
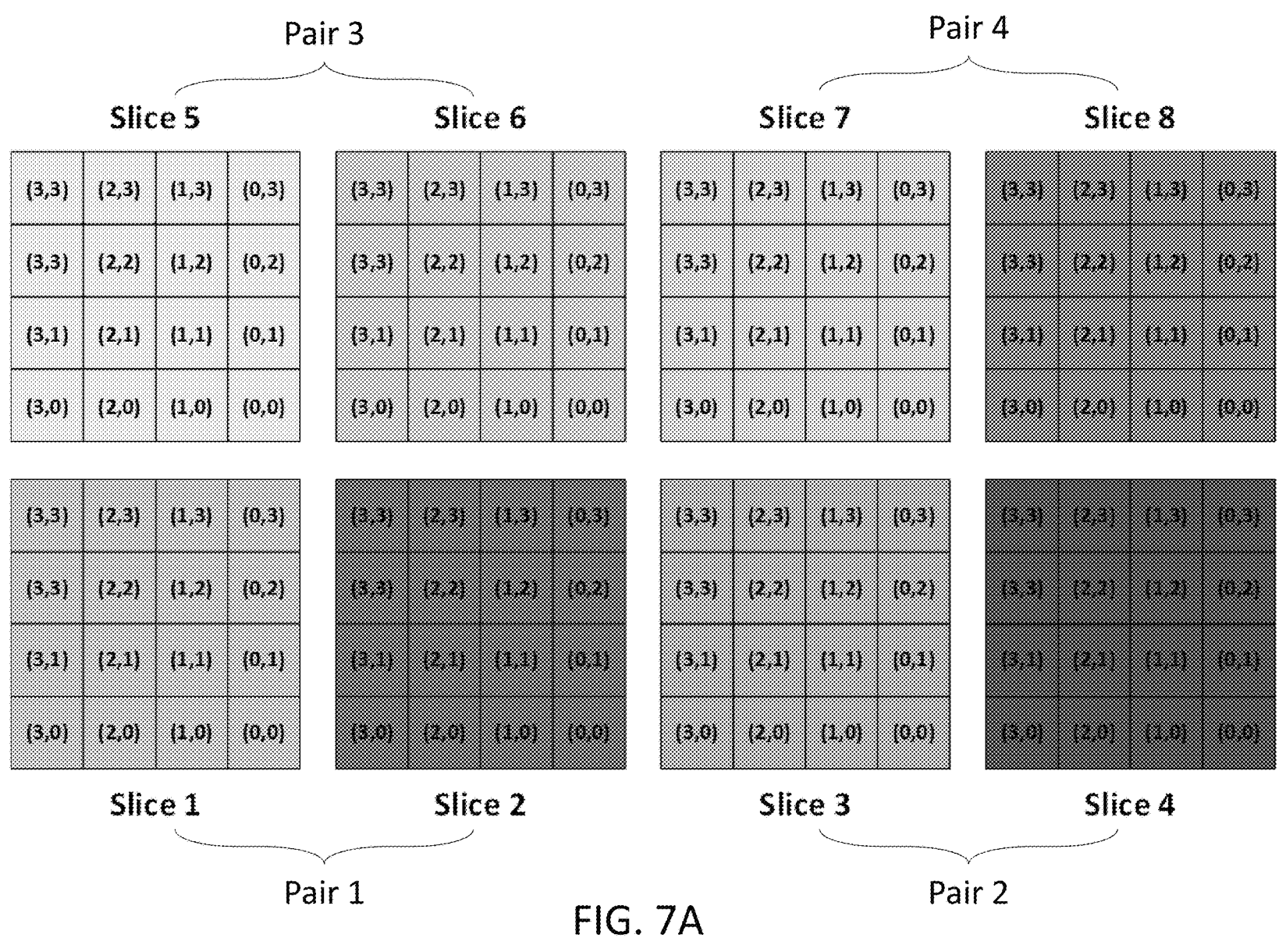
Figure 7B:
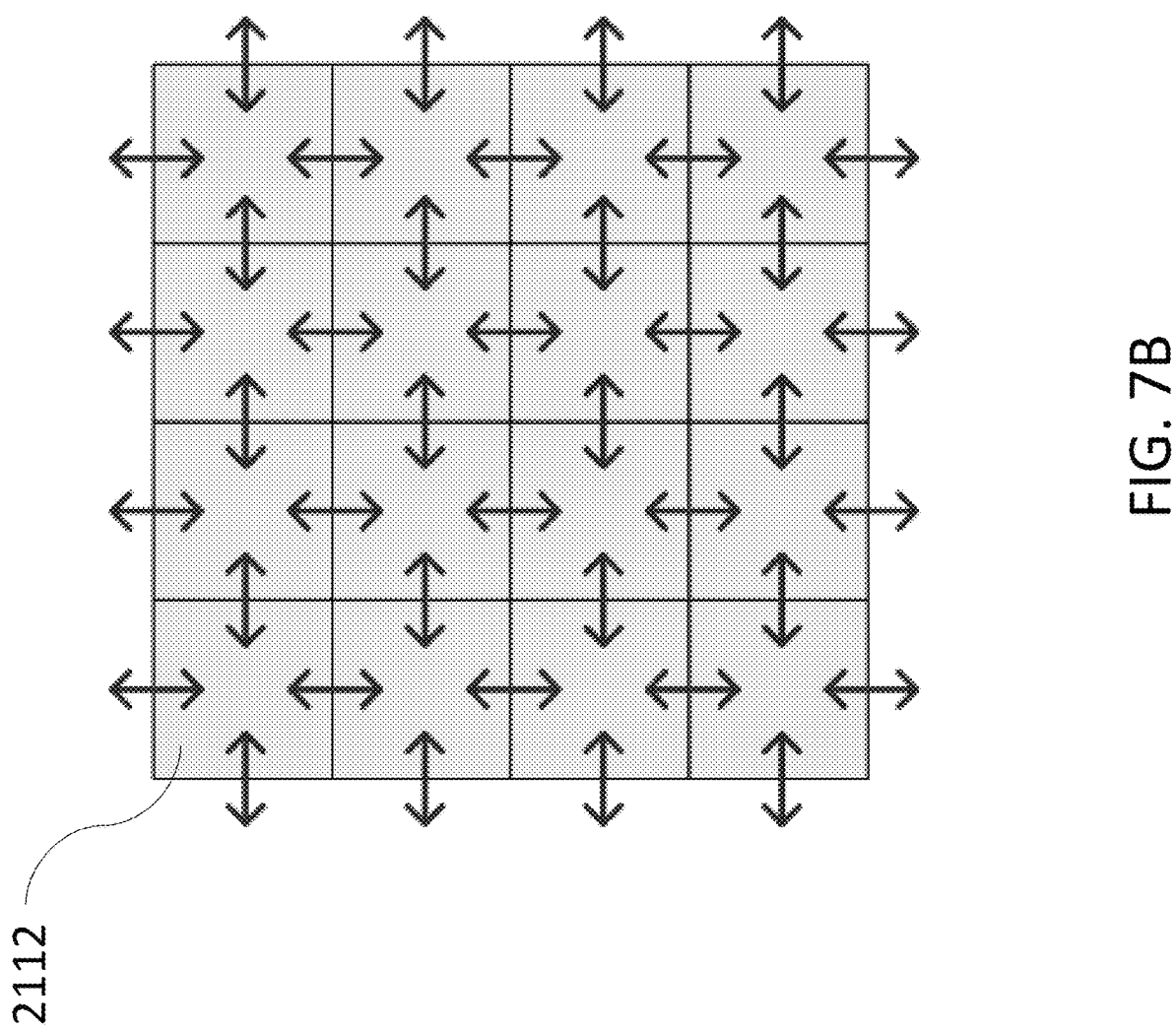
FIG. 7B is an illustration detailing the data transfer within a single CST slice of FIG. 7A.

The CST circuits 2112 in the primary logic block 2110 may be arranged logically as a three-dimensional array to provide greater flexibility in how digital data is processed and transferred between the CST circuits 2112. That is, even though the CST circuit 2112 are on a two-dimensional substrate, their interconnections may be configured such that logically they form a three-dimensional array (e.g., like a two-dimensional matrix can be used to represent three spatial dimensions). The CST circuits 2112 may be arranged as a set of logical two-dimensional slices, where each slice contains a subset of the array of CST circuits 2112. For example, FIG. 7A shows an exemplary slice diagram where 128 CST circuits 2112 are divided into 8 slices with each slice having a 4 by 4 array of CST circuits 2112. As illustrated in FIG. 7B, each CST circuit 2112 within the 4 by 4 array of the slice may transfer data to neighboring CST circuits 2112. Additionally, the slices may be paired such that data from the CST circuit 2112 of one slice may be transferred to the CST circuit 2112 in another slice with matching (X, Y) coordinates. For example, in the slice diagram of FIG. 7A, data may be exchanged between slices 1 and 2 (pair 1), 3 and 4 (pair 2), 5 and 6 (pair 3), and 7 and 8 (pair 4). Processing of digital data may also be performed on a per slice basis, where the clock select circuit 2114 and the counter circuit 2116 performs operations on a particular slice of CST circuits 2112, independent of operations being performed concurrently on other slices of CST circuits 2112.

Figure 8B:
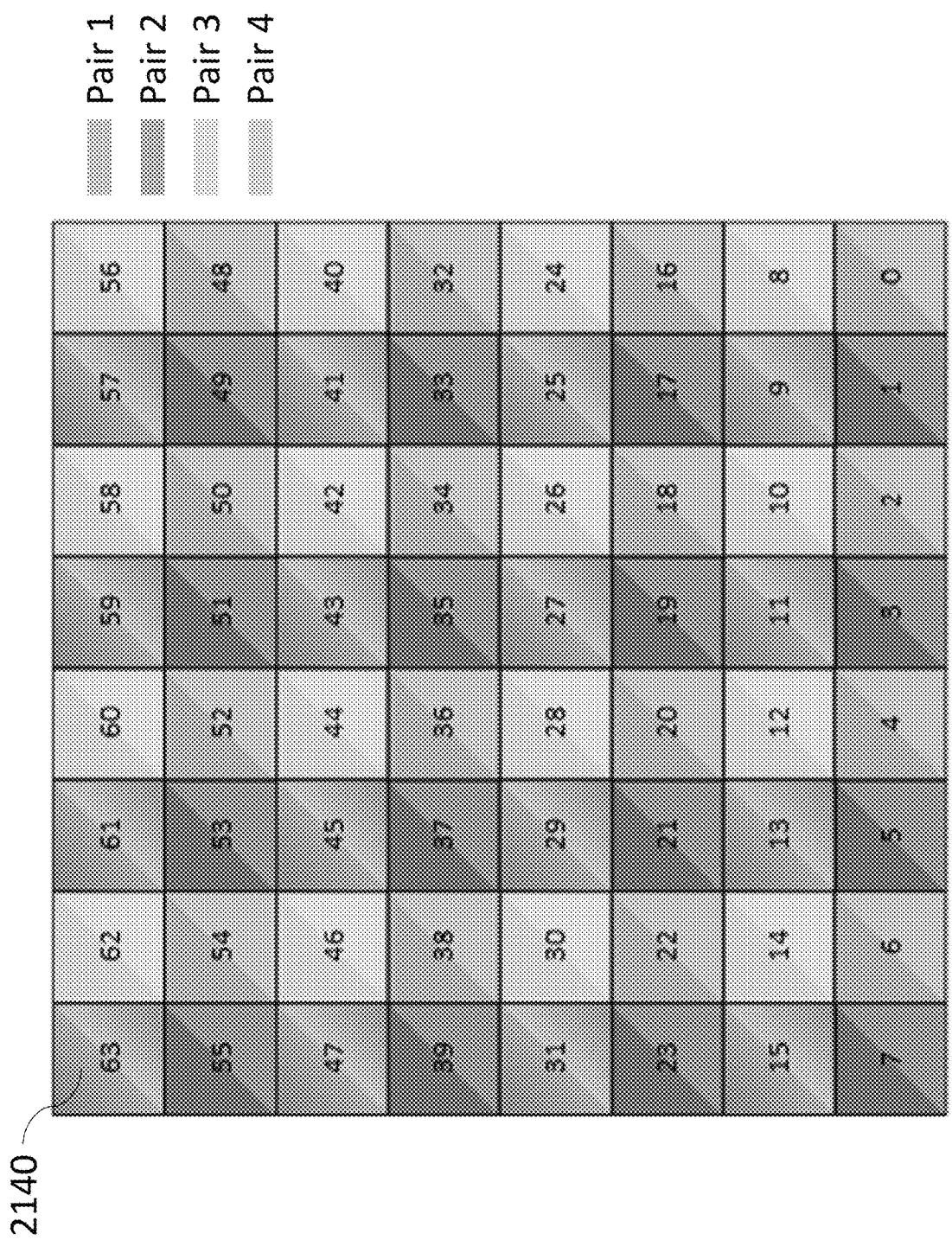
FIG. 8B is an illustration of the relationship between 3D pixel inputs and CSTs in a second operating mode of an FPIA.
Figure 8C:
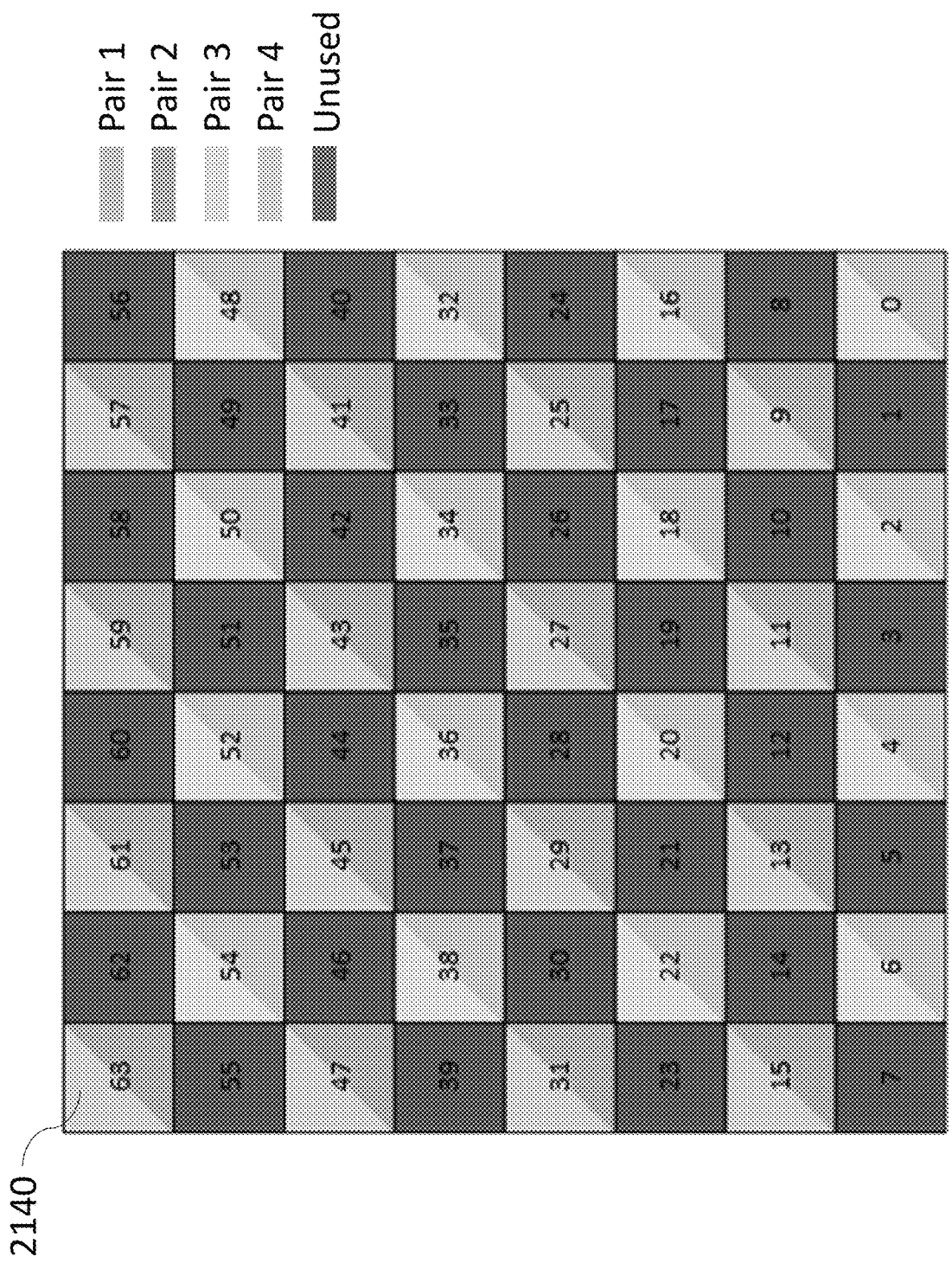
FIG. 8C is an illustration of the relationship between 3D pixel inputs and CSTs in a third operating mode of an FPIA.

For example, FIG. 8A shows an exemplary assignment of 64 3D pixel inputs 2140 supported by the macropixel element 2100 to different pairs of slices of CST circuits 2112 (4 pairs of slices in total), as shown in FIG. 7A. FIG. 8B shows another exemplary assignment where data from each 3D pixel input 2140 is split between two pairs of slices of CST circuits 2112. FIG. 8C shows yet another exemplary assignment where the 64 3D pixel inputs 2140 are parsed down to a 32-input configuration with half of the 64 3D pixel inputs 2140 being unused. The CST control 2124 may also be used to control whether the macropixel element 2100 is bypassed (i.e., skipped) during a readout operation. For example, the portion of the sensor array corresponding to the macropixel element 2100 may be unused during one clock cycle or may be undergoing processing that utilizes several clock cycles.

The interrupt control 2126 is comprised of circuitry that may interrupt the operation of the primary logic block 2110 if certain conditions are met (e.g., the bit value of a CST circuit 2112 exceeds a threshold value). The interrupt control 2126 may be used to alert the system and/or user of an event that (e.g., an error occurs during processing). The interrupt control 2126 may interrupt operation on only a portion of the data, such as a single slice of CST circuits 2112, while allowing concurrent processing on other slices of CST circuits 2112. At least one opcode from the opcode control circuit 2120 may be used as input for the interrupt control 2126.

The data multiplexer 2128 is comprised of circuitry that receives as input, digital data from the 3D pixel inputs 2140. The data multiplexer 2128 may be used to facilitate serial data transfer operations (e.g., shifts of digital data) within a single macropixel element 2100 and/or across multiple macropixel elements 2100. The data multiplexer 2128 may pass along at least a portion of the digital data to the CST circuits 2112 based on inputs from the CST control 2124 and the opcode control circuit 2120. The data multiplexer 2128 may also manage the inflow and outflow of data between macropixel elements 2100 using one or more fixed interconnects. For example, the data multiplexer 2128 may be used to facilitate the transfer of digital data among macropixel elements 2100 (e.g., serial data transfer) en route to the FPGA elements 2300 of the FPIA chip 2000 for subsequent processing.

Figure 9B:
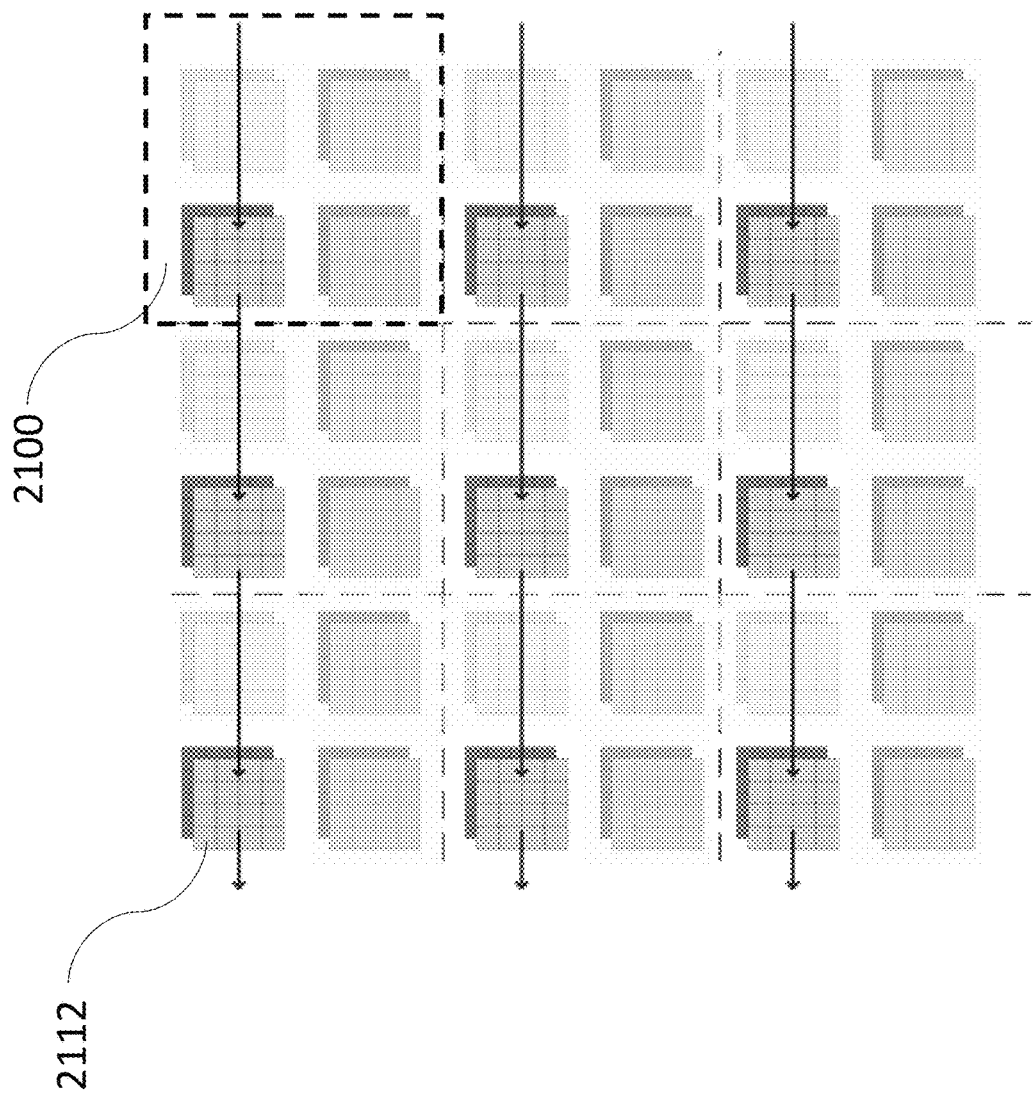
FIG. 9B is an illustration detailing serial data transfer between CSTs in the same slice across multiple macropixel elements under a pixel shift left command.
Figure 9C:
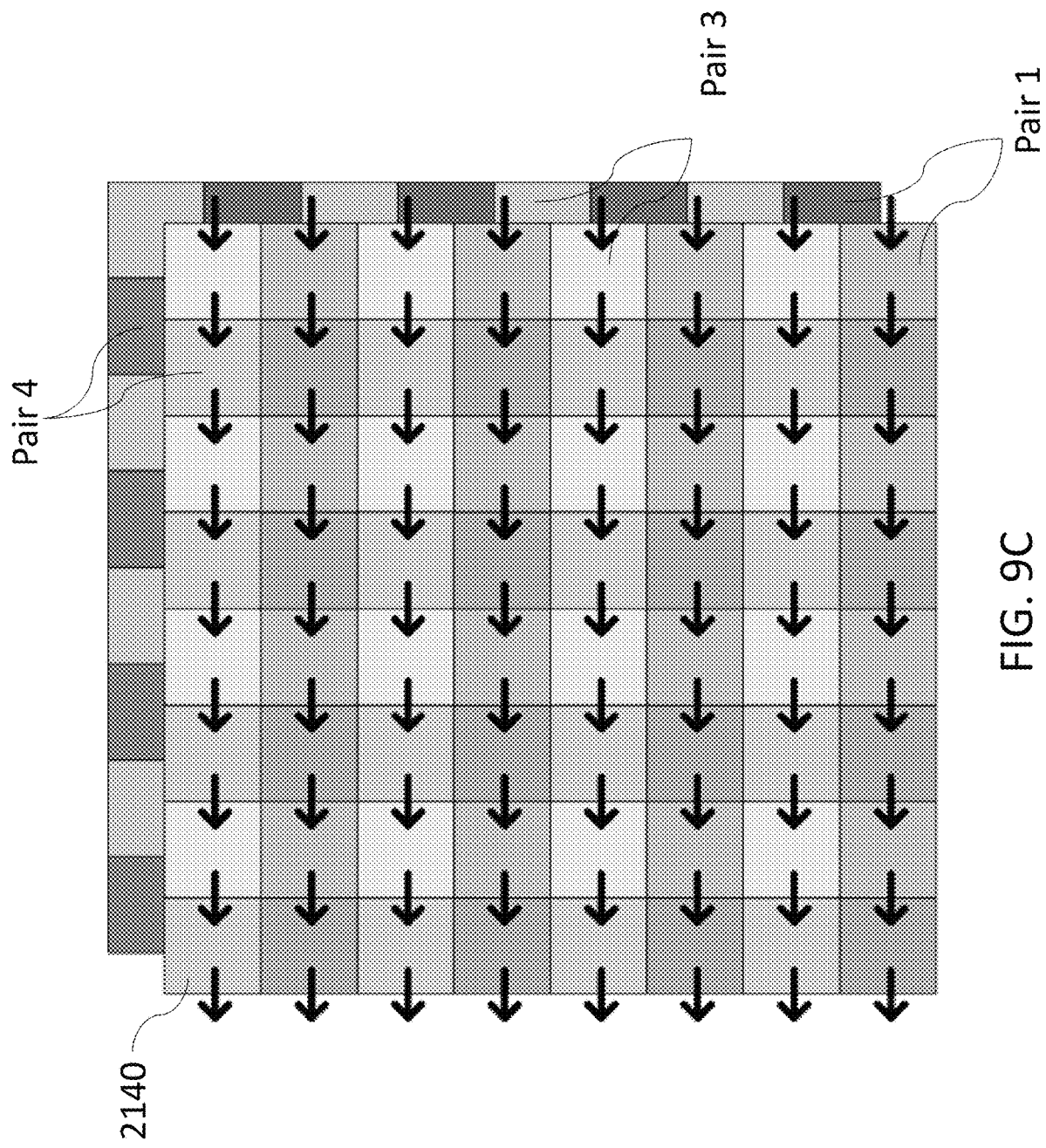
FIG. 9C is an illustration detailing serial data transfer between CSTs in neighboring slices under a pixel shift left command.
Figure 9D:
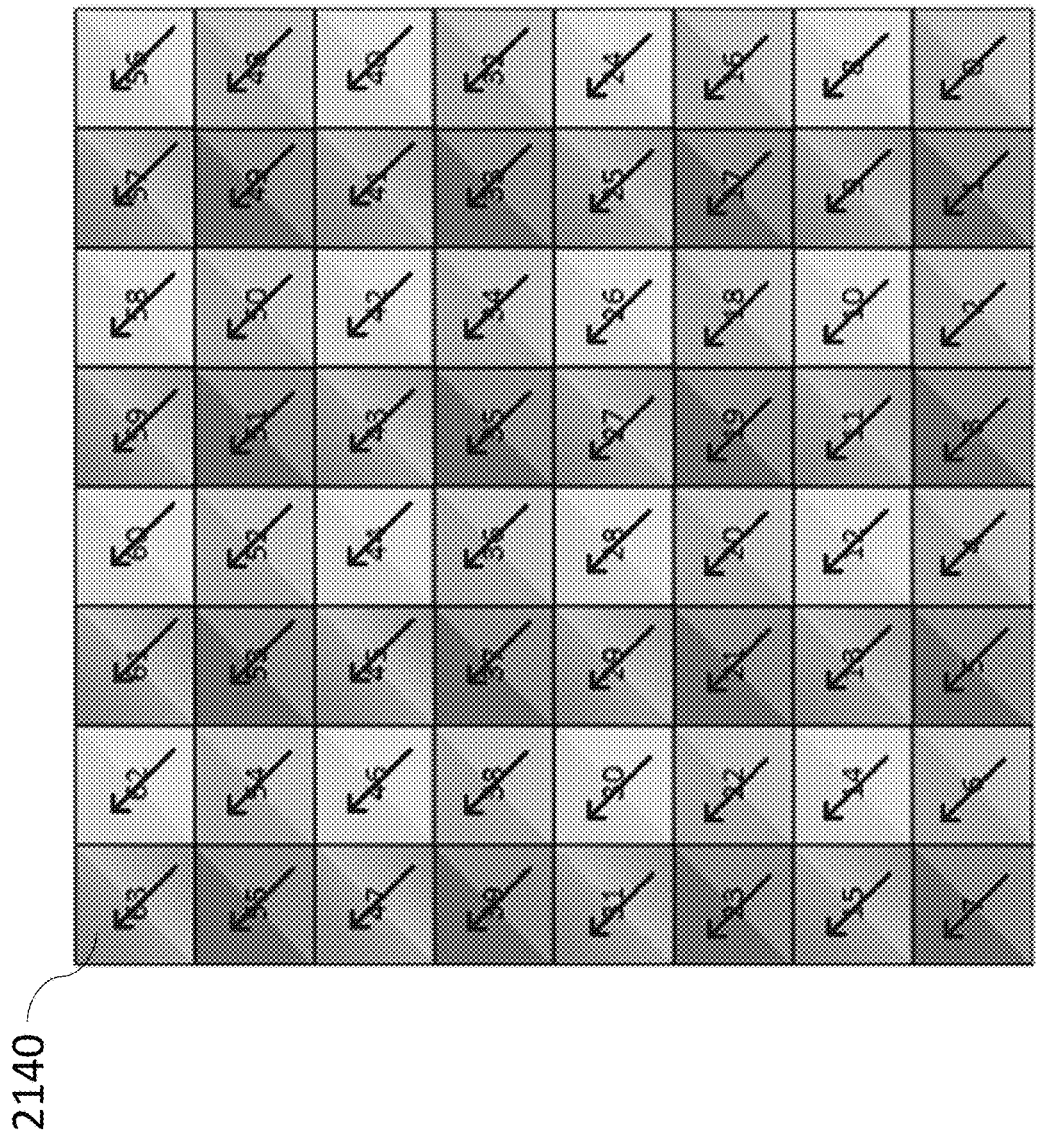
FIG. 9D is an illustration detailing parallel data transfer between pairs of CSTs.
Figure 9E:
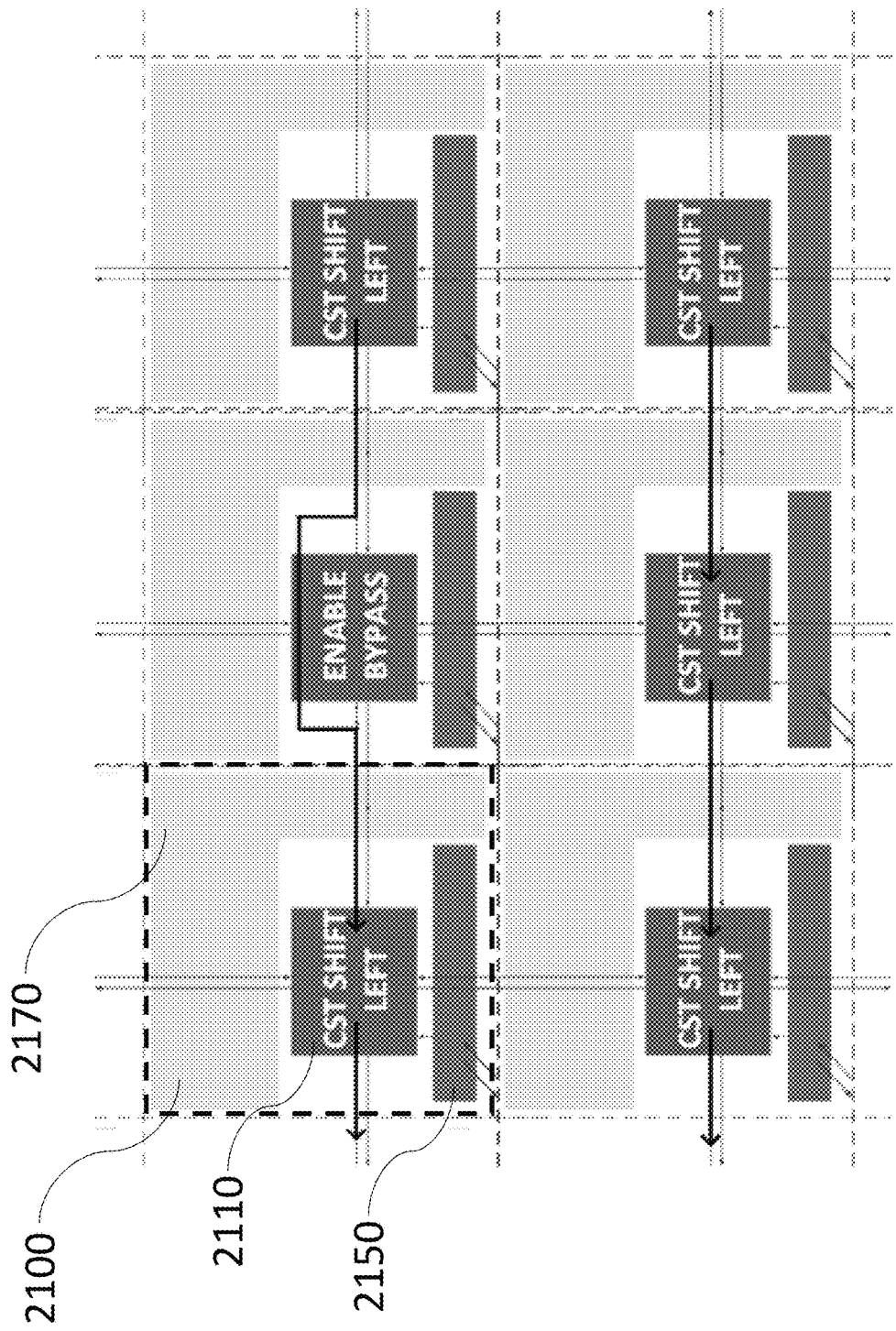
FIG. 9E is an illustration of bypassing a macropixel element during readout.

FIG. 9A shows an exemplary serial data transfer that shifts the digital data assigned to each CST circuit 2112 in a 4 by 4 array slice of CST circuits 2112 to the left by one CST circuit 2112. FIG. 9B shows an exemplary serial data transfer that shifts the digital data from the same slice across multiple macropixel elements 2100 to the left by one macropixel element 2100. FIG. 9C shows an illustration corresponding to the 64 3D pixel inputs 2140 of FIG. 8A, where a serial data transfer operation is performed to transfer data between neighboring slices of CST circuits 2112 (e.g., data is exchanged between slice 1 and slice 2 of CST circuits 2112, which are assigned to different 3D pixel inputs 2140). FIG. 9D shows the 64 3D pixel inputs 2140 of FIG. 8B, which may enable parallel data transfer between pairs of CST circuits 2112 (e.g., data is exchanged between slice 1 and slice 2 of CST circuits 2112, which are assigned to the same 3D pixel input 2140). The CST control 2124 in each macropixel element 2100 may also be used to control whether digital data from a particular macropixel element 2100 is read during a serial data transfer operation. FIG. 9E shows an exemplary case where a serial data transfer operation skips one macropixel element 2100.

Figure 10:
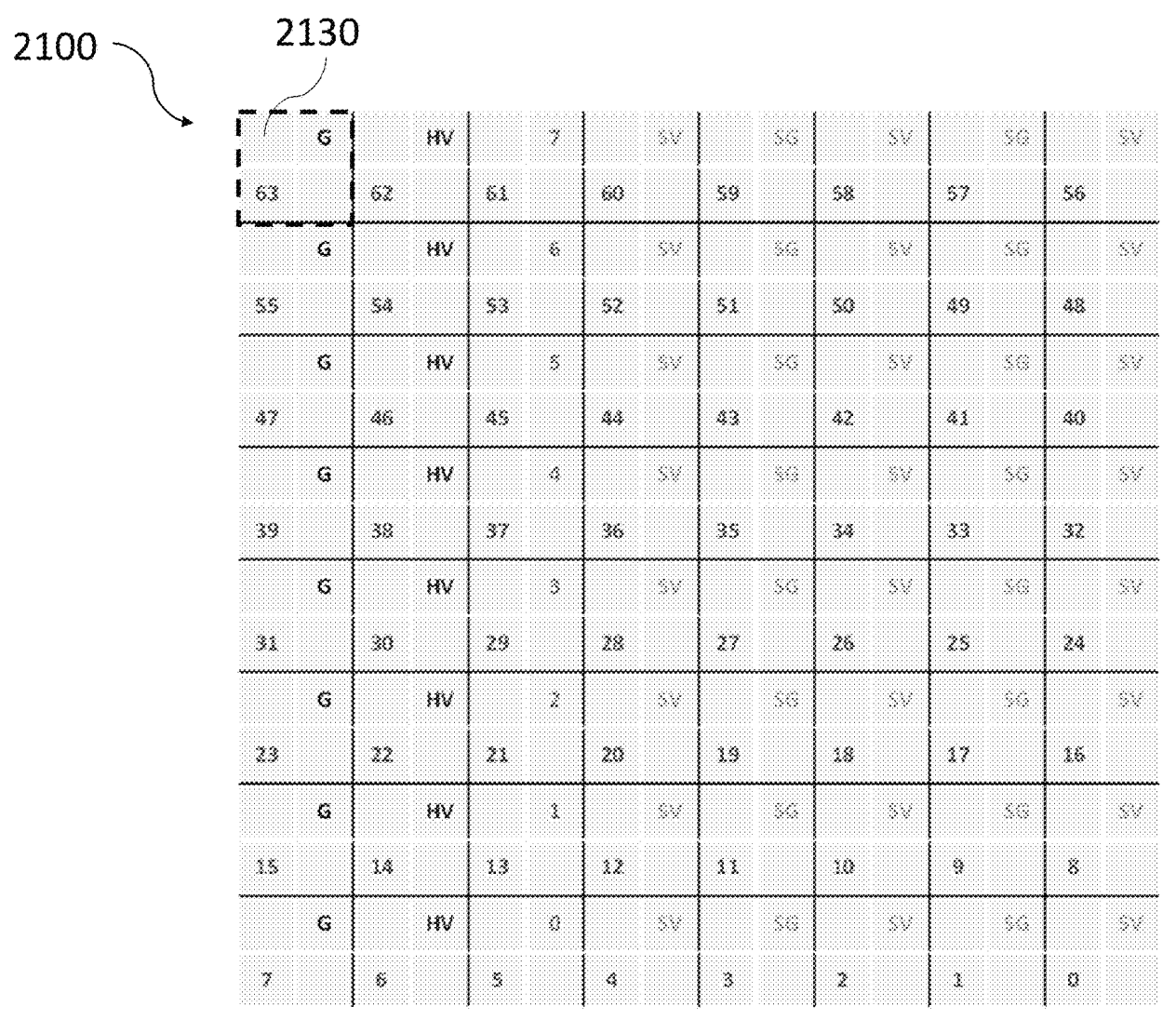

FIG. 10 shows a schematic diagram of an exemplary physical layout detailing the integration of the various components of the macropixel element 2100. As shown in FIG. 10, the macropixel element 2100 may be subdivided into an 8 by 8 grid of squares 2130. Each square 2130 may include a reconfigurable interconnect 2170 and a 3D pixel input 2140. Each square 2130 may also include connections to one of the following functions: a 3D GPIO 2150 (labelled as 0-7), a ground connected to the 3D GPIO 2150 (labelled as "G"), a 1.8 V supply connected to the 3D GPIO 2150 (labelled as "HV"), a global power connection supplied to the FPIA chip 2000 (labelled as "SV"), a global ground connection for the FPIA chip 2000 (labelled as "SG"), or for structural support during 3D integration.

Deserializer Elements

As described above, the deserializer elements 2200 may be used to convert serial data transferred from the macropixel elements 2100 to parallel data for subsequent processing by the various FPGA elements 2300 in the FPIA chip 2000. Not every FPIA chip 2000 needs deserializer elements 2200 to support operation. In some examples, the FPIA chip 2000 may include one or more macropixel elements 2100 electronically coupled directly to the FPGA elements 2300. The potential benefits of utilizing deserializer elements 2200 include higher data throughput and faster processing, which may be especially valuable for larger format sensor arrays where a reliance on serial data transfer may inhibit operation of the FPIA chip 2000 at higher clock frequencies.

Figure 11A:
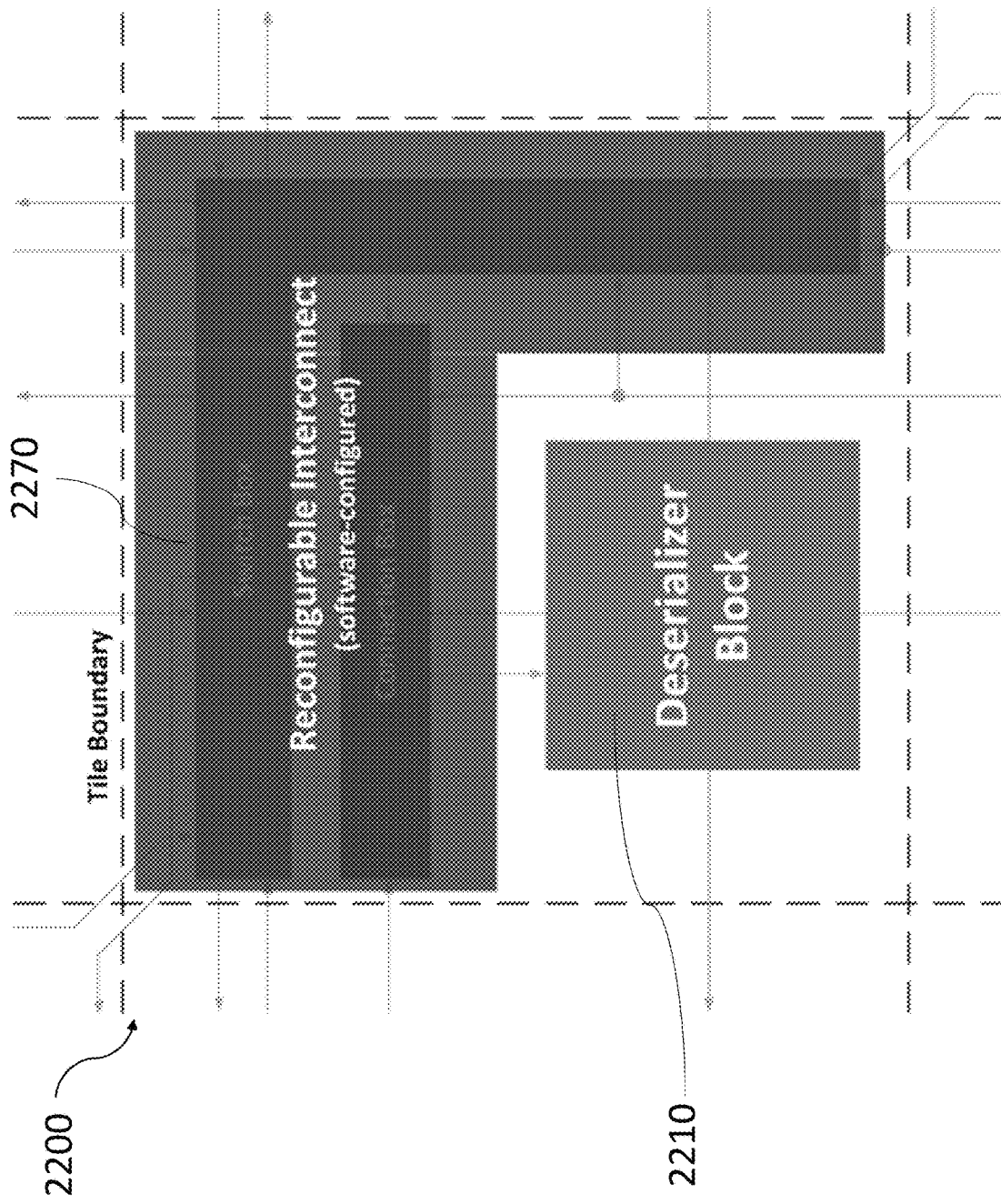
FIG. 11A is a tile block diagram of a deserializer element.

FIG. 11A shows a representative tile block diagram for a single deserializer element 2200. As shown, the deserializer element 2200 may include a deserializer block 2210 to perform logical operations and a reconfigurable interconnect 2270, which may be configured via software based on the desired operating modes of the FPIA chip 2000. The deserializer block 2210 may include a subset of the macropixel element 2100 functionality paired with custom logic to provide a clean, high-throughput interface between the macropixel elements 2100 and other circuitry in the FPIA chip 2000. Based on the exemplary FPIA chip 2000 of FIG. 5A, two variants of deserializer blocks 2210 may be used corresponding to (1) the deserializer elements 2200 on the top and bottom of the macropixel elements 2100 and (2) the deserializer elements 2200 on the left and right of the macropixel elements 2100. Both variants of deserializer elements 2200 are effectively identical and differ only by the arrangement of CST circuits 2212 in relation to the (X, Y, Z) coordinates of the macropixel elements 2100.

Figure 11B:
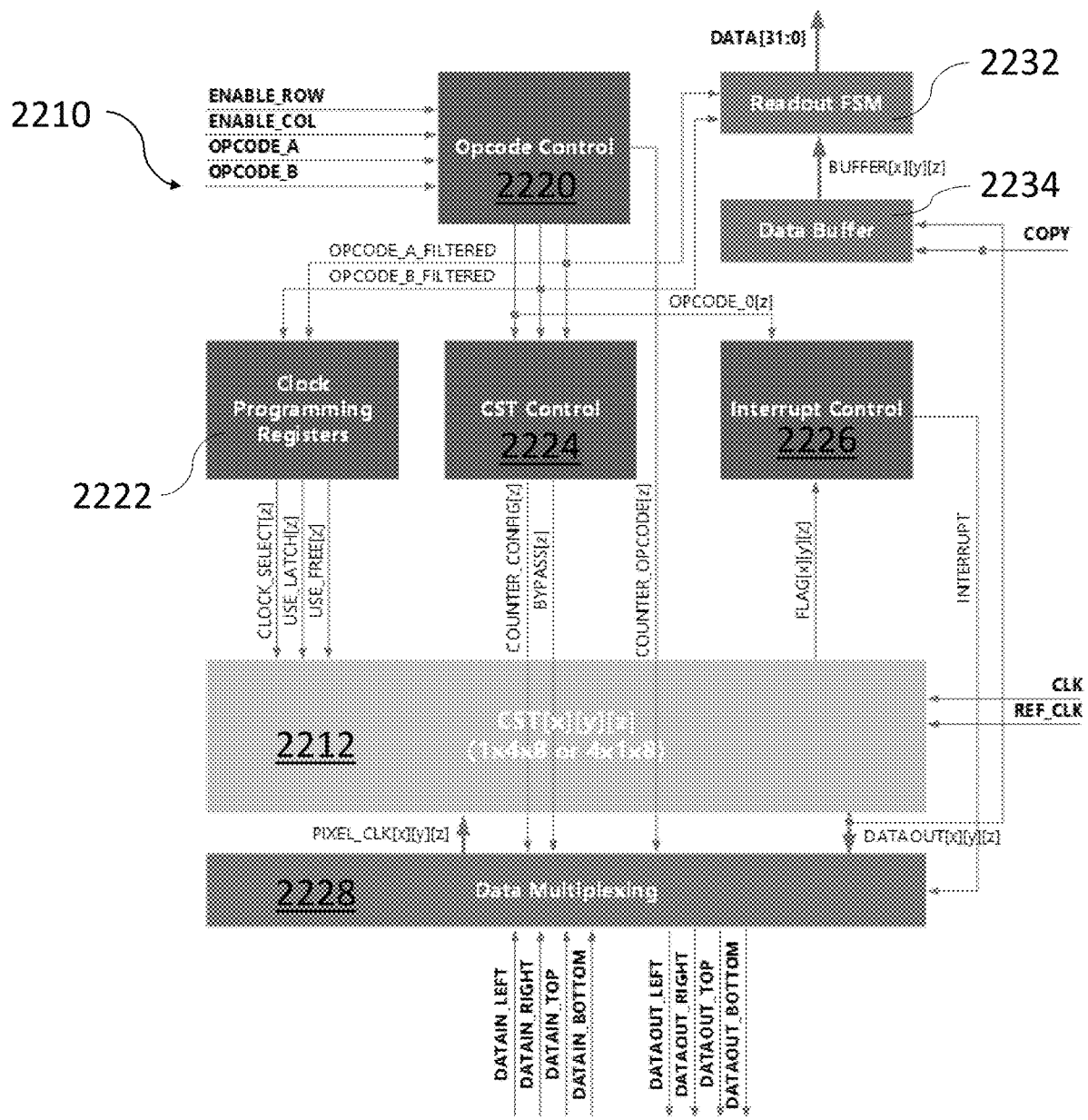
FIG. 11B is a circuit block diagram of the deserializer element of FIG. 11A.

FIG. 11B shows a more detailed circuit block diagram of the deserializer block 2210. The deserializer block 2210 shares several similarities with the macropixel element 2100, including use of CST circuits 2212, an opcode control circuit 2220, a clock programming register 2222, a CST control circuit 2224, an interrupt control 2226, and a data multiplexer 2228.

Figure 12:
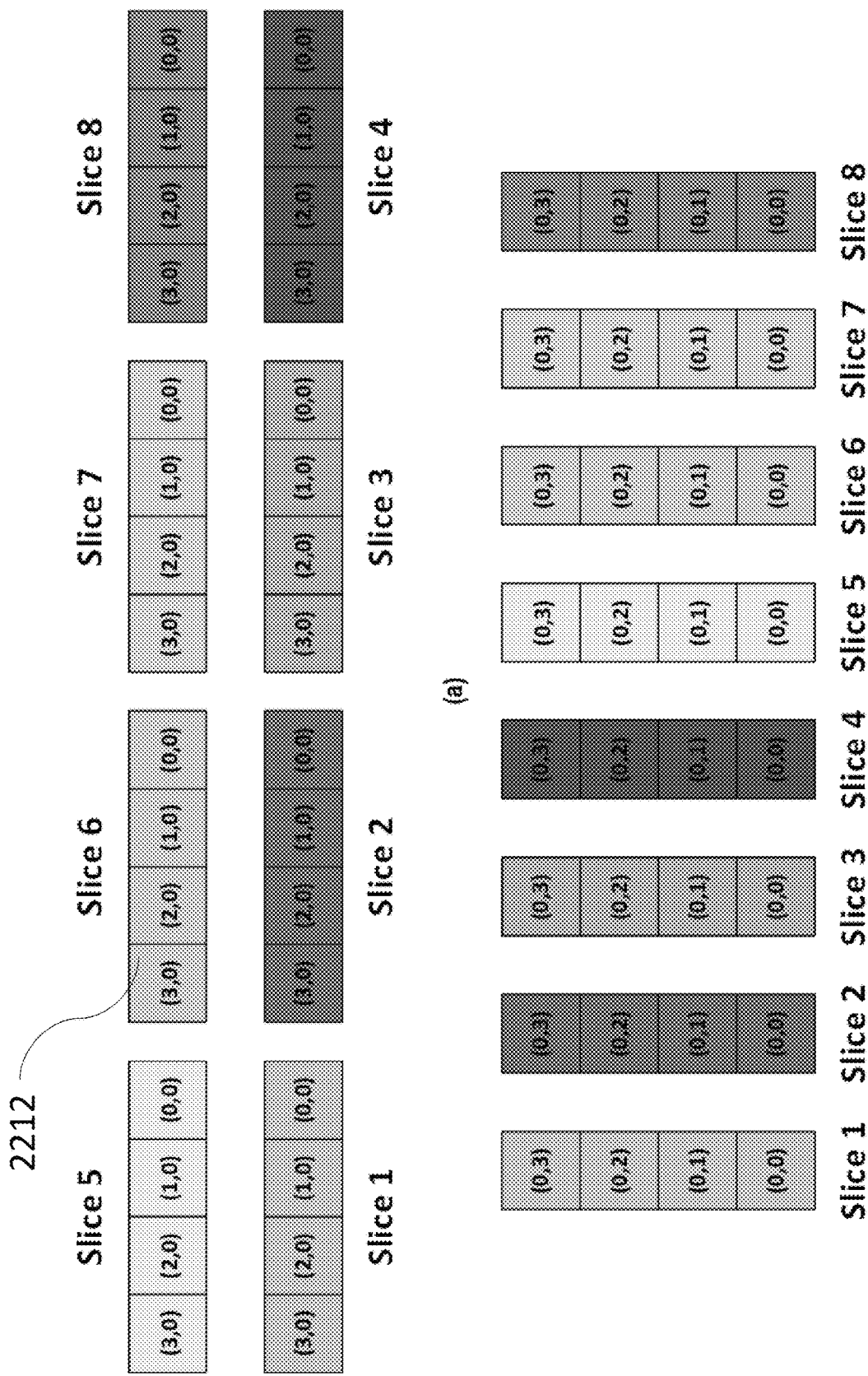
FIG. 12 is an illustration of deserializer elements arranged as a two-dimensional array and further subdivided according to (1) top and bottom deserializer elements and (2) left and right deserializer elements.

The CST circuits 2212 in the deserializer block 2210 may also have an architecture substantially similar to the CST circuits 2112 of the macropixel element 2100 described above. The number of CST circuits 2212 may be less than or equal to the number of CST circuits 2212 in the macropixel element 2100. The CST circuits 2212 may be arranged as a three-dimensional array with at least one dimensions matching the three-dimensional array of CST circuits 2212 in the macropixel element 2100. For example, FIG. 12 shows an exemplary array of deserializer elements 2200 arranged into multiple 4 by 1 (or 1 by 4) slices. The number of slices in FIG. 12 corresponds to the number of slices used for the array of CST circuits 2212 in FIG. 7A. As shown in FIG. 12, the slices may be reduced in dimensionality according to the particular variant of the deserializer element 2200 (e.g., top and bottom or left and right).

The opcode control circuit 2220, the CST control circuit 2224, the interrupt control 2226, and the clock programming register 2222 may have an architecture substantially similar to the opcode control circuit 2120, the CST control circuit 2124, the interrupt control 2126, and the clock programming register 2122 of the macropixel element 2100 described above.

The data multiplexer 2128 may also have an architecture substantially similar to the data multiplexer of the macropixel element 2100. The data multiplexer 2228 may include modifications to accommodate the differences in the number and arrangement of the CST circuits 2212 for the deserializer element 2200 compared to the macropixel element 2100. For example, the output busses of the data multiplexer 2228 may be truncated along the left/right sides for top/bottom deserializer elements 2200 or along the top/bottom sides for left/right deserializer elements 2200. The data multiplexer 2228 may not include inputs originating from the 3D pixel inputs 2140 or the 3D GPIO 2150 since such circuitry is not directly coupled to the deserializer elements 2200. The data multiplexer 2228 may also support additional data transfer operations not available to the macropixel elements 2100, such as operations that allow parallel data transfer from CST circuit 2112 to CST circuit 2112 along the left/right directions in top/bottom deserializer elements 2200 and along the top/bottom directions in the left/right deserializer elements 2200.

The deserializer block 2210 may also include a readout finite state machine (FSM) 2232 and a data buffer 2234. The readout FSM 2232 manages parallel data transfer from the deserializer elements 2200 to other circuitry in the FPIA chip 2000. The readout FSM 2232 receives, at least a portion of the digital data stored in the data buffer 2234 and at least one opcode from the opcode control 2220 as input. The data buffer 2234 is used to store digital data output by the CST circuits 2212 and may be controlled by external signals (e.g., labelled COPY) to control when the data buffer 2234 reads in and out digital data from the CST circuit 2112 and the readout FSM 2232, respectively.

Figure 13:
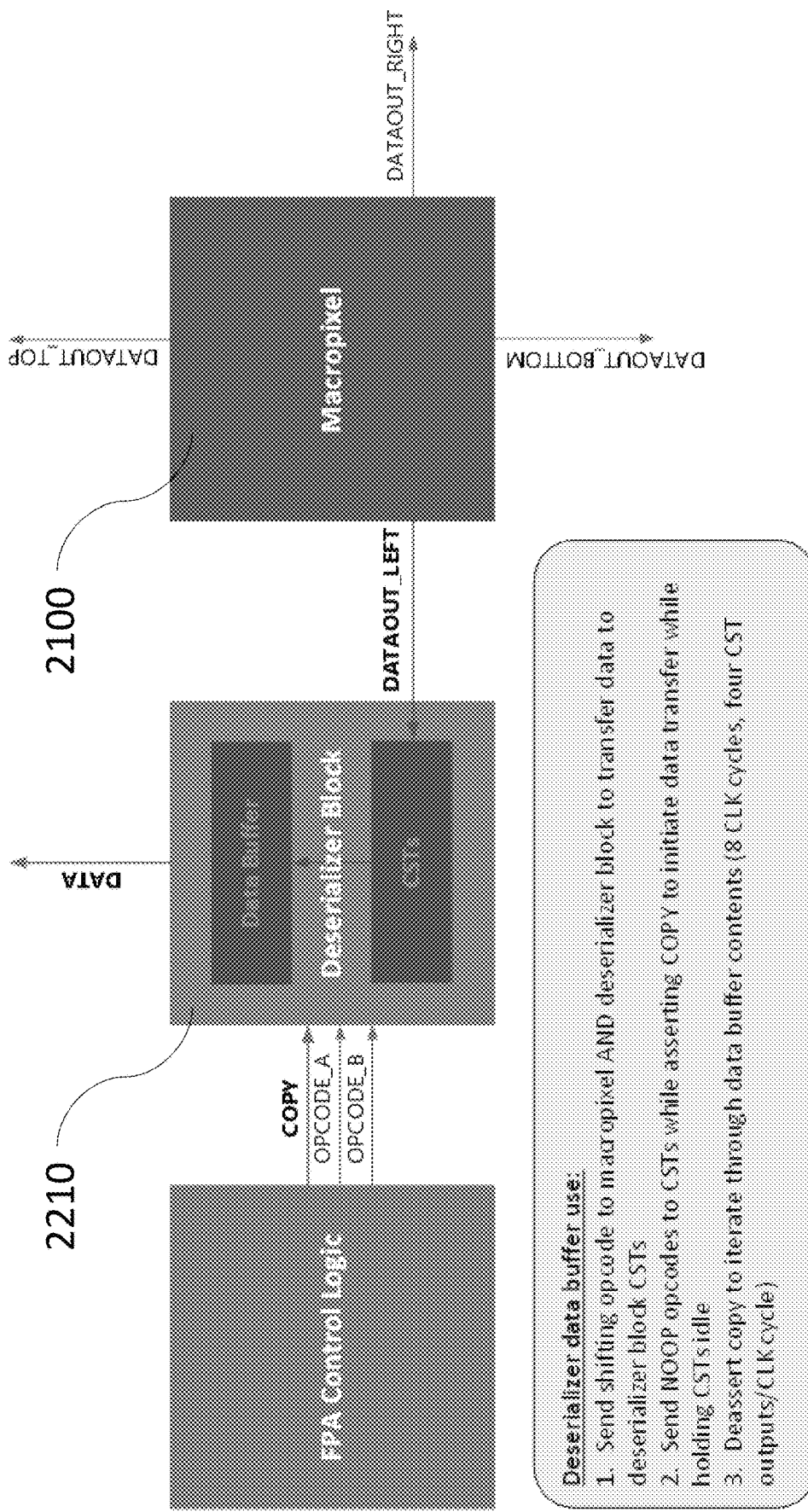
FIG. 13 is a block diagram detailing the integration of a deserializer element with a macropixel element and an FPGA element.

FIG. 13 shows a block diagram detailing the integration of a deserializer block 2210 in the FPIA chip 2000 according to one example. As shown, the deserializer block 2210 may receive as inputs, digital data from a macropixel element 2100 via a fixed interconnect and opcodes originating from the bitstream and/or I/O elements 2400 via a reconfigurable interconnect. The deserializer block 2210 may then output parallel digital data to other circuitry (e.g., the FPGA elements 2300) via the reconfigurable interconnect 2270 for subsequent processing. The opcodes may be used to control the receipt and transmission of digital data from the deserializer element 2200. The reconfigurable interconnect 2270 allows digital data to be passed on to various combinations of general-purpose FPGA elements 2320, DSP FPGA elements 2340, and memory FPGA elements 2360, which may be configured to provide customized processing functionality.

FPGA Elements

The FPGA elements 2300 can provide numerous functions in the FPIA chip 2000 including, but not limited to controlling the macropixel elements 2100 and processing digital (image) data received by the macropixel elements 2100 to produce new outputs that may then be transmitted off the FPIA chip 2000. One or more FPGA elements 2300 may be coupled, directly in the case where deserializer elements 2200 are not used or indirectly via the deserializer elements 2200, to at least one macropixel element 2100. As described above, various types of FPGA elements 2300 may be used including general-purpose FPGA elements 2320, DSP FPGA elements 2340, and memory FPGA elements 2360, which may be used individually or in combination to process the digital data.

Figure 14A:
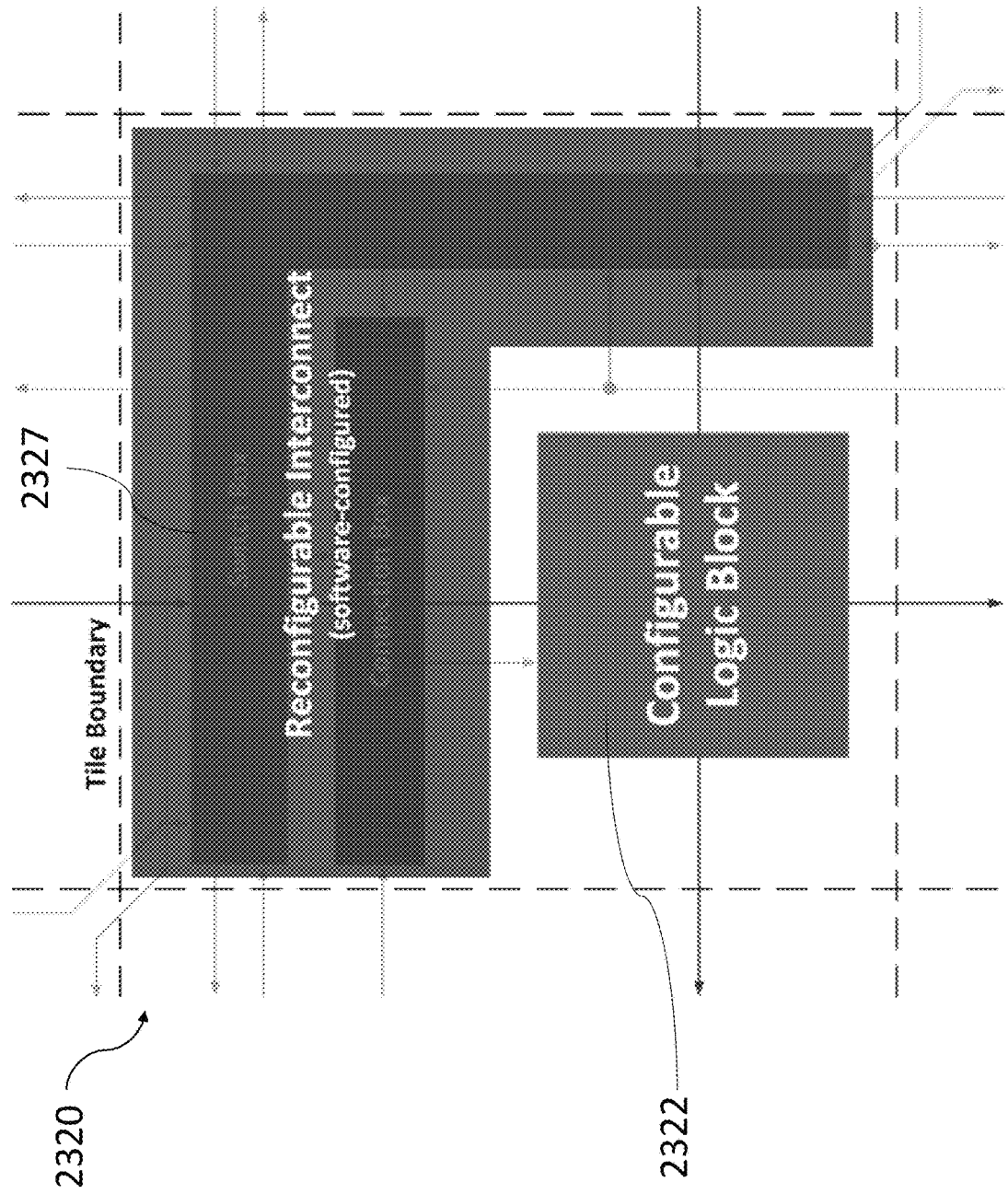
FIG. 14A is a tile block diagram of a general-purpose FPGA element with a configurable logic block.
Figure 14B:
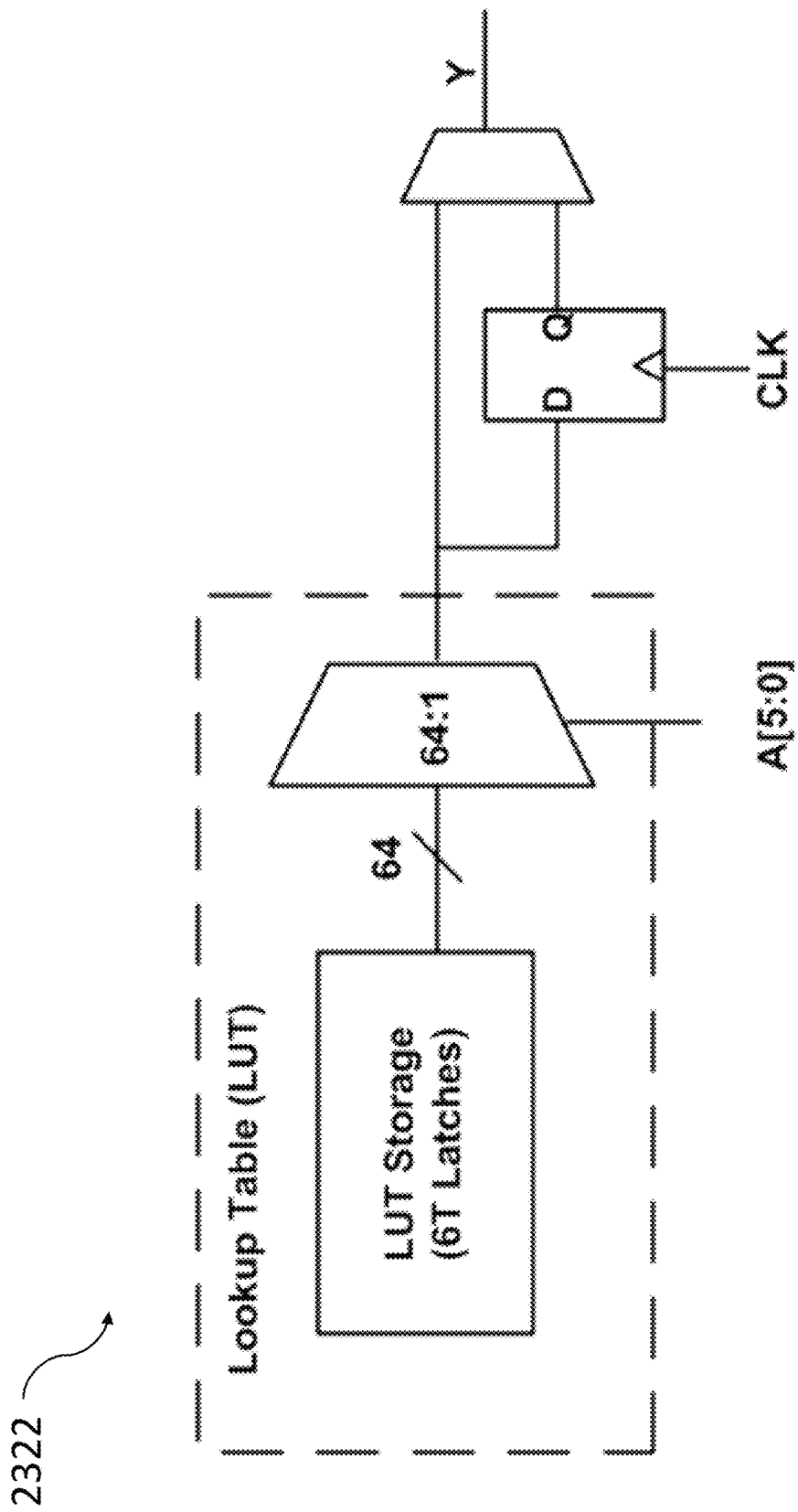
FIG. 14B is a circuit block diagram of a basic logic element (BLE) in the configurable logic block of FIG. 14A.

FIG. 14A shows a representative tile block diagram for the general-purpose FPGA element 2320. As shown, the general-purpose FPGA element 2320 is comprised of a configurable logic block (CLB) 2322 coupled to a reconfigurable interconnect 2327. The CLB 2322 is comprised of one or more basic logic elements (BLEs), where each BLE may include FPGA circuitry such as a 6-input look up table (LUT) and a flip-flip. FIG. 14B shows an exemplary circuit block diagram of the CLB 2322. The general-purpose FPGA element 2320 is intended to provide logic functionality for a particular application, which may then be changed for subsequent applications via software.

Figure 15A:
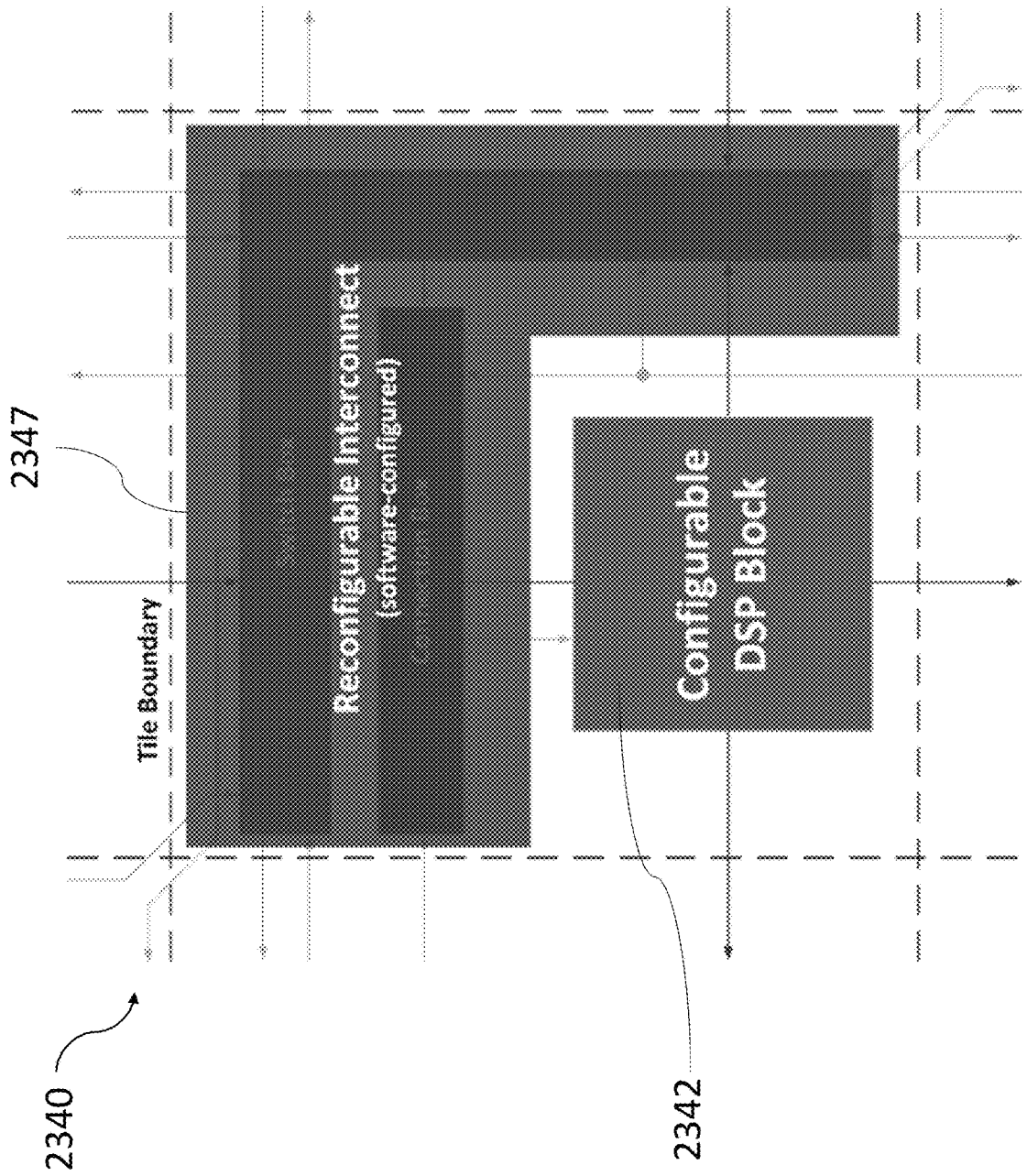
FIG. 15A is a tile block diagram of a digital signal processing (DSP) FPGA element with a configurable DSP block.

FIG. 15A shows a representative tile block diagram for the DSP FPGA element 2340. As shown, the DSP FPGA element 2340 may include a configurable DSP block 2342 coupled to a reconfigurable interconnect 2347. The integration of the DSP block 2342 includes one or more independent arithmetic units that share a common set of I/O pins. The DSP block 2342 may be configured via software such that the desired arithmetic unit used is connected to the DSP block I/Os while the remaining arithmetic units are idle during application runtime. Each arithmetic unit in the DSP block 2342 may be further pipelined to improve overall application performance. Performance of the DSP FPGA element 2340 may also be improved by immediately registering the digital data entering the DSP block 2342 to reduce the latency of the reconfigurable interconnect 2347 and subsequently reregistering the digital data again when exiting the DSP block 2342 back into the reconfigurable routing fabric.

Figure 15B:
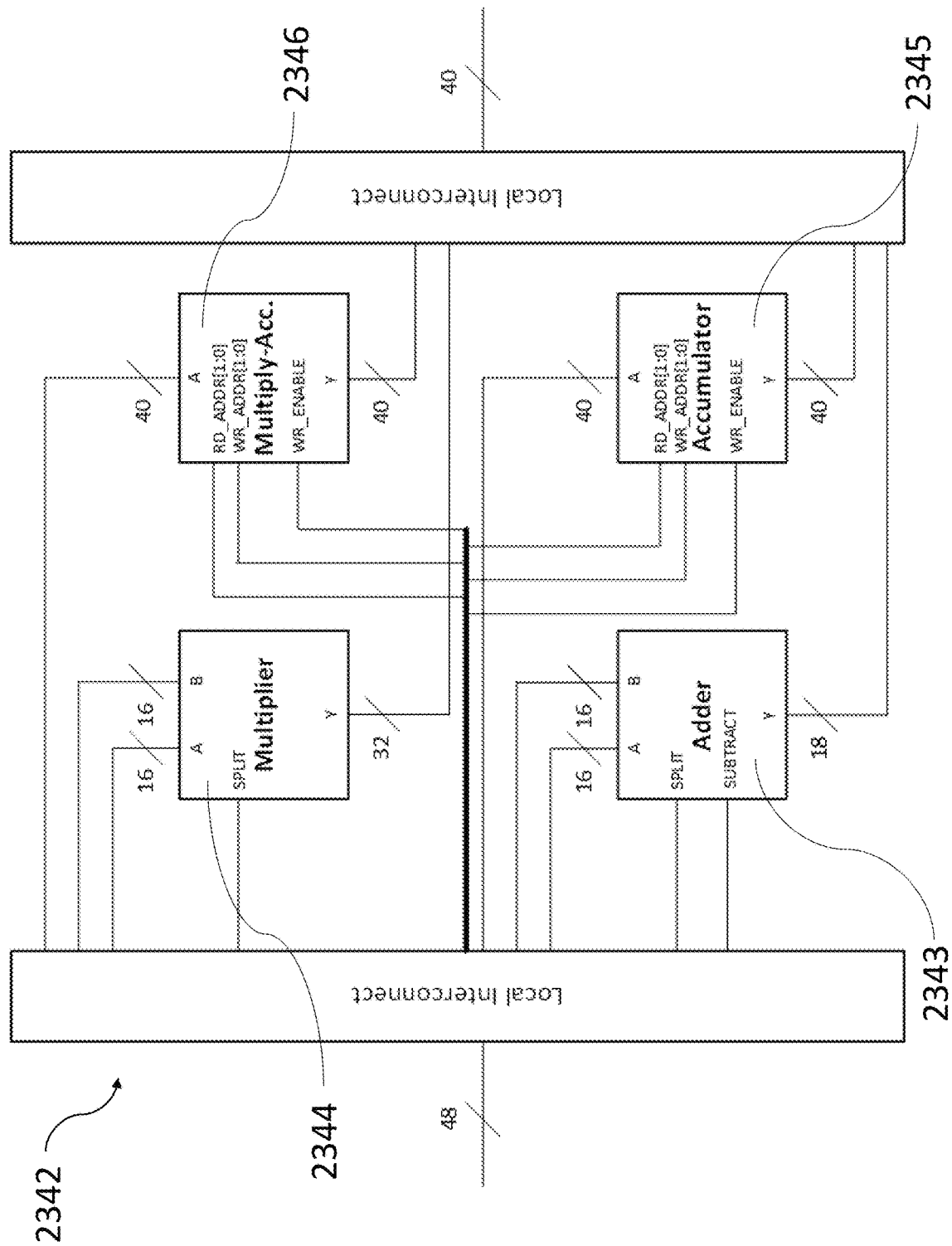
FIG. 15B is a circuit block diagram of the configurable DSP block of FIG. 15A.

FIG. 15B shows an exemplary circuit block diagram of a DSP block 2342, which includes four arithmetic units: an adder 2343, a multiplier 2344, an accumulator 2345, and a multiply accumulator 2346. Thus, the latency of the DSP block 2342 may depend on which arithmetic unit is used. The adder 2343 may support several functional modes including, but not limited to addition, subtraction, split addition (where subsets of the inputs are added together), and split subtraction (where subsets of the inputs are subtracted from one another). The multiplier 2344 may support several functional modes including, but not limited to addition and split multiplication (where subsets of the inputs are multiplied together). The functional modes of the adder 2343 and the multiplier 2344 may be dynamically switched during operation rather than having to be reconfigured. The accumulator 2345 may be a register used to temporarily store intermediate outputs generated by an adder 2343 in the DSP block 2342. The multiply accumulator 2346 may be a register used to temporarily store intermediate outputs generated by a multiplier 2344 in the DSP block 2342.

Figure 16:
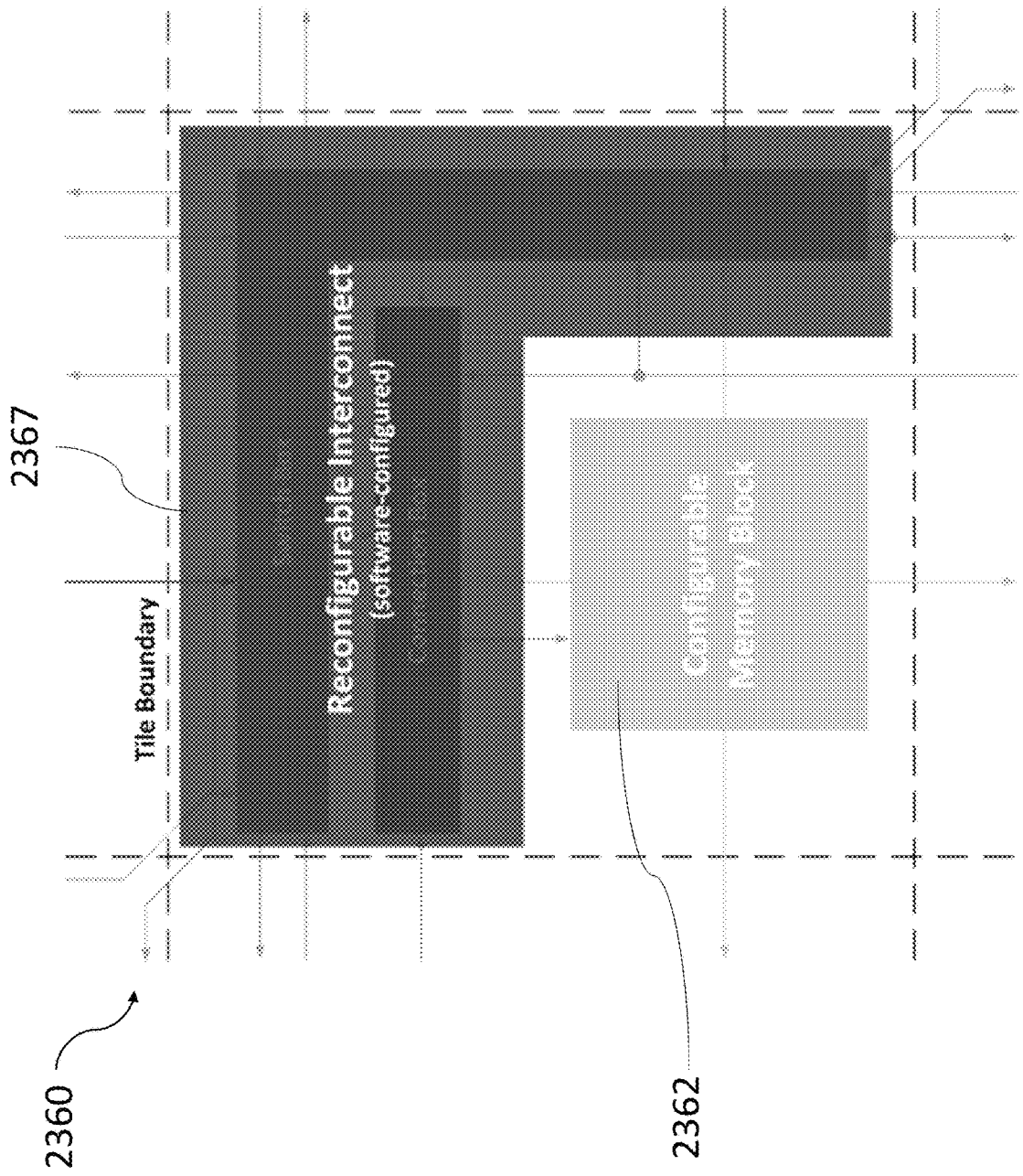
FIG. 16 is a tile block diagram of a memory FPGA element with a configurable memory block.

FIG. 16 shows a representative tile block diagram for the memory FPGA element 2360. As shown, the memory FPGA element 2360 may include a configurable memory block 2362 coupled to a reconfigurable interconnect 2367. The memory block 2362 may include various memory types including, but not limited to static random-access memory (SRAM) and dynamic random-access memory (DRAM). For example, the memory block 2362 may be comprised of a single port 128 Kbit SRAM. The amount of memory contained within the memory block 2362 may not be configurable via software. However, to increase the amount of memory available for a particular process, multiple FPGA memory blocks 2360 may be coupled together to provide greater capacity.

I/O Elements

The I/O element 2400 on the FPIA chip 2000 may also be reconfigurable. The configuration of the I/O element 2400 may affect various aspects in the function of the contact pads in the FPIA chip 2000 including, but not limited to whether the contact pads of the FPIA chip 2000 function as an input or an output, the function and timing of the contact pads with the FPGA elements 2300, and the electrical settings (e.g., voltage and current limits) on the contact pads. As described above, various types of I/O elements 2400 may be used such as the GPIO elements 2420 and the LVDS I/O elements 2440. The GPIO elements 2420 may be configured for single-ended signaling where the GPIO element 2420 interfaces with a single contact pad on the FPIA chip 2000. The LVDS I/O element 2440 interfaces with two contact pads on the FPIA chip 2000, which form a differential pair.

Figure 17A:
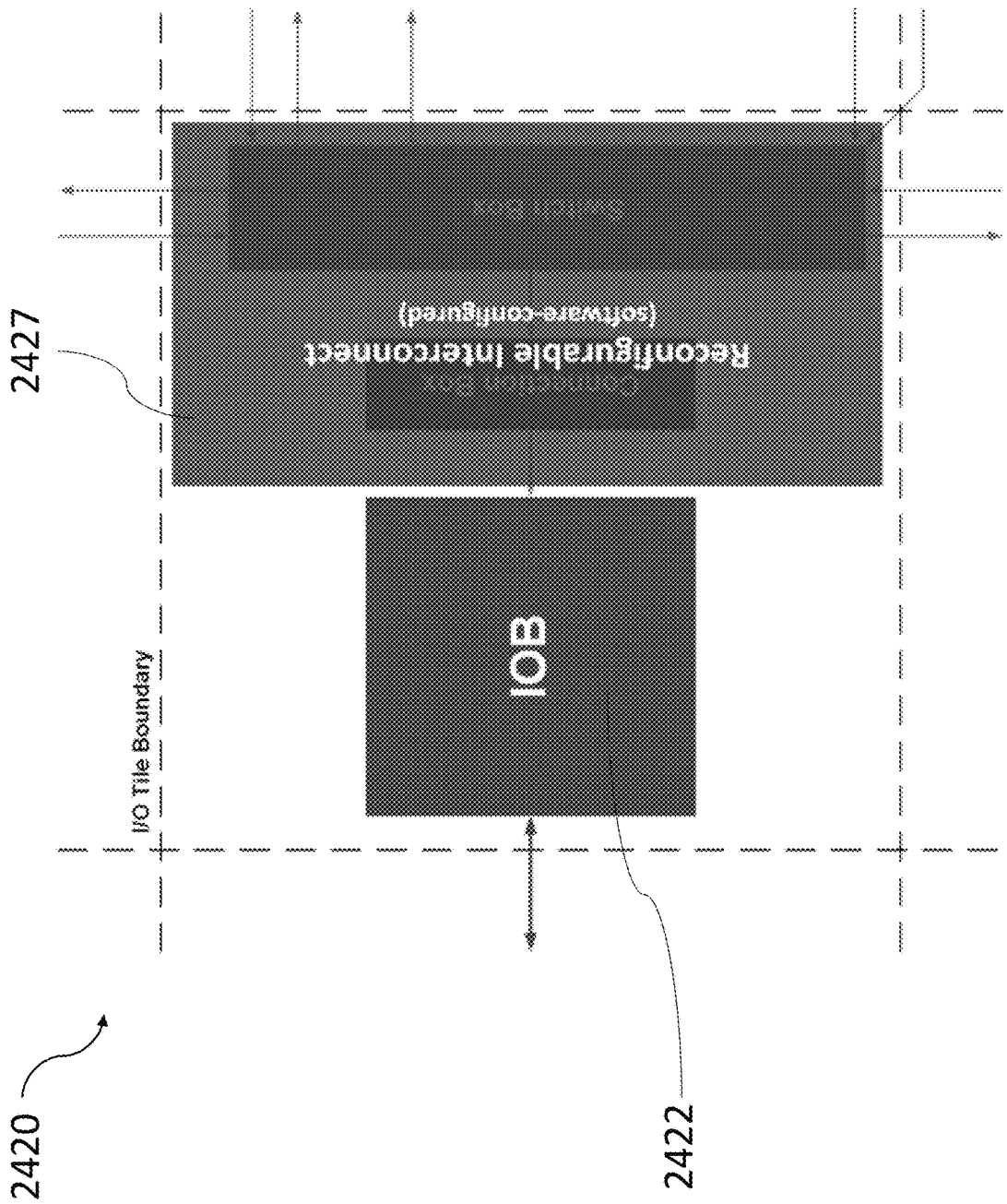
FIG. 17A is a tile block diagram of a general-purpose input/output (I/O) element.

FIG. 17A shows a representative tile block diagram for the GPIO element 2420. As shown, the GPIO element 2420 may include a I/O block (IOB) 2422 coupled to a reconfigurable interconnect 2427. Each IOB 2422 provides an interface to a single contact pad on the FPIA chip 2000. The IOB 2422 may be used to modify settings including, but not limited to the drive strength of the contact pad (e.g., the amount of current that can flow through the contact pad at a particular voltage) and the direction of the digital data (e.g., input or output).

Figure 17B:
FIG. 17B is a tile block diagram of a low-voltage differential-signaling (LVDS) input/output (I/O) element.

FIG. 17B shows a representative tile block diagram for the LVDS I/O element 2440. As shown, the LVDS I/O element 2440 may include a LVDS I/O block (LVDS IOB) 2442 coupled to a reconfigurable interconnect 2447. The LVDS I/O element 2440 may provide a digital interface between the general-purpose FPGA elements 2320, the DSP FPGA elements 2340, and the memory FPGA elements 2360 and one or more high-speed LVDS transmitters and/or receivers. The LVDS transmitter/receivers are mixed signal circuits that include (1) digital logic to receive data arriving at a user-defined clock frequency and buffer it for high speed transmission and (2) analog circuitry to take buffered digital data from the digital logic and drive it onto a contact pad at a standard frequency and standard voltage levels. The LVDS transmitters and receivers may each correspond to a contact pad on the FPIA chip 2000. In some instances, the LVDS IOB 2442 may receive digital data in a single-ended digital form and transmit via a LVDS transmitter. In some instances, the LVDS IOB 2442 may receive digital data from a LVDS receiver and transmit in single-ended digital form.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed.

Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A field programmable imaging array (FPIA) chip, comprising:
   a substrate;
   a plurality of macropixel elements, disposed on the substrate, to process digital data, each one of the macropixel elements including non-reconfigurable circuitry;
   a plurality of field programmable gate array (FPGA) elements, disposed on at least a portion of the substrate in electronic communication with the plurality of macropixel elements, to receive processed digital data from the plurality of macropixel elements;
   a plurality of reconfigurable interconnects, disposed on the substrate, to reconfigurably connect the plurality of macropixel elements to the plurality of FPGA elements; and
   a plurality of deserializer elements, disposed on the substrate, to convert serial digital data from the plurality of macropixel elements to parallel digital data for processing by the plurality of FPGA elements.

2. The FPIA chip of claim 1, wherein a first reconfigurable interconnect in the plurality of reconfigurable interconnects is configured to be dynamically reconfigured to electronically couple at least one FPGA element to each macropixel element.

3. The FPIA chip of claim 1, wherein a second reconfigurable interconnect in the plurality of reconfigurable interconnects is configured to be dynamically reconfigured to electronically couple at least one macropixel element in the plurality of macropixel elements to a first deserializer element in the plurality of deserializer elements.

4. The FPIA chip of claim 3, wherein a third reconfigurable interconnect in the plurality of reconfigurable interconnects is configured to be dynamically reconfigured to electronically couple at least one FPGA element in the plurality of FPGA elements to the first deserializer element.

5. The FPIA chip of claim 1, further comprising:
   a plurality of input/output (I/O) elements, disposed on the substrate, to at least one of receive a control signal or supply a signal output.

6. The FPIA chip of claim 5, wherein a fourth reconfigurable interconnect in the plurality of reconfigurable interconnects is configured to be dynamically reconfigured to electronically couple at least one FPGA element to a first I/O element in the plurality of I/O elements.

7. A method of processing data with a field programmable imaging array (FPIA) chip, the FPIA chip comprising a substrate, macropixel elements disposed on the substrate, and field programmable gate array (FPGA) elements disposed on the substrate in electronic communication with the plurality of FPGA elements, the method comprising:
   processing digital data with the macropixel elements;
   transferring processed digital data from the macropixel elements to the FPGA elements;
   reconfiguring connections between the macropixel elements and the FPGA elements; and
   converting serial digital data from the macropixel elements to parallel digital data for processing by the FPGA elements.

8. The method of claim 7, wherein reconfiguring connections between the macropixel elements and the FPGA elements comprises:
   connecting a first macropixel element to a first FPGA element at a first time step; and
   connecting the first macropixel element to a second FPGA element at a second time step.

9. The method of claim 7, further comprising:
   reconfigurably coupling a first macropixel element to a deserializer element that converts the serial digital data to parallel digital data.

10. The method of claim 9, further comprising reconfigurably connecting the deserializer element to a first FPGA element.

11. The method of claim 7, further comprising:
    reconfigurably connecting a first FPGA element to an input/output (I/O) element; and
    receiving a control signal and/or supplying a signal output with the I/O element.

12. An apparatus, comprising:
    a sensor array chip to generate analog data;
    a sensor interface chip, having a first side disposed on a first side of the sensor array chip, to convert the analog data to digital data; and
    a digital processing chip, having a first side disposed on a second side of the sensor interface chip, to process the digital data provided by the sensor interface chip, the digital processing chip comprising a plurality of deserializer elements to convert serial digital data to parallel digital data,
    wherein a second reconfigurable interconnect in the plurality of reconfigurable interconnects is configured to be dynamically reconfigured to electronically couple at least one macropixel element to a first deserializer element in the plurality of deserializer elements.

13. The apparatus of claim 12, wherein the digital processing chip comprises a field programmable imaging array (FPIA) chip, the FPIA chip comprising:
    a plurality of macropixel elements to receive and/or generate the digital data from the sensor interface chip inputs and outputs; and
    a plurality of field programmable gate array (FPGA) elements, in electronic communication with the plurality of macropixel elements, to process the digital data.

14. The apparatus of claim 13, wherein a first macropixel element in the plurality of macropixel elements is configured to receive digital data representing light detected by a first sensor in the sensor array chip.

15. The apparatus of claim 14, wherein the first macropixel is configured to be dynamically reconfigured to receive digital data representing light detected by a second sensor in the sensor array chip.

16. The apparatus of claim 15, wherein the first macropixel element includes non-reconfigurable circuitry.

17. The apparatus of claim 13, further comprising:
a plurality of reconfigurable interconnects, disposed on the FPIA chip, to reconfigurably connect the plurality of macropixel elements to the plurality of FPGA elements.

18. The apparatus of claim 17, wherein a first reconfigurable interconnect in the plurality of reconfigurable interconnects is configured to be dynamically reconfigured to electronically couple at least one FPGA element to a first macropixel element in the plurality of macropixel elements.

19. The apparatus of claim 17, further comprising:
a plurality of input/output (I/O) elements, disposed on the FPIA chip, to receive a control signal and provide a signal output.

20. The apparatus of claim 19, wherein a fourth reconfigurable interconnect in the plurality of reconfigurable interconnects is configured to be dynamically reconfigured to electronically couple at least one FPGA element to a first I/O element in the plurality of I/O elements.

21. The apparatus of claim 12, wherein a third reconfigurable interconnect in the plurality of reconfigurable interconnects is configured to be dynamically reconfigured to electronically couple at least one FPGA element to the first deserializer element.

* * * * *